United States Patent
Gurr et al.

(10) Patent No.: US 10,890,288 B2
(45) Date of Patent: Jan. 12, 2021

(54) SYSTEMS AND METHODS OF PROVIDING A MULTIPOSITIONAL DISPLAY

(71) Applicant: Microsoft Technology Licensing, LLC, Redmond, WA (US)

(72) Inventors: Kae-Ling Jacquline Gurr, Seattle, WA (US); Jonne Aapi Harju, Kirkland, WA (US); Eric Paul Witt, Redmond, WA (US); Timothy Guyton Escolin, Seattle, WA (US); Ryan Eugene Whitaker, Seattle, WA (US); Young Soo Kim, Bellevue, WA (US); James David Wahl, Woodinville, WA (US); Daniel Clark Park, Woodinville, WA (US); Bruce James Sandmeyer, Redmond, WA (US); Scott Ashley Rutschman, Dundee, OR (US); William Loren Emery, Sherwood, OR (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 383 days.

(21) Appl. No.: 15/953,114

(22) Filed: Apr. 13, 2018

(65) Prior Publication Data
US 2019/0316729 A1  Oct. 17, 2019

(51) Int. Cl.
*F16M 11/10* (2006.01)
*F16M 11/04* (2006.01)
(Continued)

(52) U.S. Cl.
CPC ........... *F16M 11/105* (2013.01); *F16F 15/10* (2013.01); *F16M 11/046* (2013.01);
(Continued)

(58) Field of Classification Search
None
See application file for complete search history.

(56) References Cited

U.S. PATENT DOCUMENTS 4,768,744 A   9/1988 Leeds et al.
4,953,256 A   9/1990 Salmela et al.
(Continued)

FOREIGN PATENT DOCUMENTS

CN    2610385 Y    4/2004
CN    101953156 A  1/2011
(Continued)

OTHER PUBLICATIONS

"Future Automation QA2-PTL Portrait to Landscape Electric TV Bracket at CEDIA 2016", Retrieved from https://www.youtube.com/watch?v=2cn4Jj0HL-U, Dec. 13, 2016, 2 Pages.
(Continued)

*Primary Examiner* — Xanthia C Cunningham
(74) *Attorney, Agent, or Firm* — Ray Quinney & Nebeker P.C.; Paul N. Taylor

(57) ABSTRACT

A device for supporting an electronic display includes a base, a display mount having a first position and a second position relative to the base, and a connection mechanism positioned between the base and the display mount. The connection mechanism is configured to rotate and translate the display mount from the first position to the second position according to a torque curve. The torque curve includes a discovery stage adjacent the first position, an initiation stage rotationally after the discovery stage, and an approach stage rotationally after the initiation stage. The connection mechanism applies a force toward the first position in the discovery stage. The connection mechanism having an initiation force applied toward the first position that is greater than the force in the discovery stage. The
(Continued)

approach stage having an approach force applied toward the second position.

20 Claims, 17 Drawing Sheets

(51) Int. Cl.
  *F16M 11/18* (2006.01)
  *H05K 5/02* (2006.01)
  *F16F 15/10* (2006.01)
  *F16H 19/00* (2006.01)
  *F16H 19/04* (2006.01)

(52) U.S. Cl.
  CPC ........... *F16M 11/18* (2013.01); *H05K 5/0234* (2013.01); *F16H 19/001* (2013.01); *F16H 19/04* (2013.01)

(56) References Cited

U.S. PATENT DOCUMENTS

| | | | |
|---|---|---|---|
| 5,233,139 | A | 8/1993 | Hofmann |
| 5,791,621 | A | 8/1998 | Yashima |
| 5,842,672 | A | 12/1998 | Sweere et al. |
| 5,941,493 | A * | 8/1999 | Cheng .................. F16M 11/105 248/371 |
| 6,227,508 | B1 | 5/2001 | Panzarella et al. |
| 6,427,288 | B1 * | 8/2002 | Saito .................... F16M 11/105 16/335 |
| 6,639,788 | B1 * | 10/2003 | Liao .................... F16M 11/105 248/292.14 |
| 6,966,532 | B2 * | 11/2005 | Ishizaki ............... F16M 11/105 248/125.1 |
| 7,159,833 | B2 | 1/2007 | Kato |
| 7,252,277 | B2 | 8/2007 | Sweere et al. |
| 7,490,796 | B2 * | 2/2009 | Kim .................... F16M 11/105 248/123.11 |
| 7,496,389 | B2 | 2/2009 | Cho |
| 7,577,466 | B2 | 8/2009 | Kim |
| 7,738,243 | B2 | 6/2010 | Oshima |
| 7,930,008 | B2 | 4/2011 | Ko |
| 8,380,257 | B2 | 2/2013 | Jeong et al. |
| 8,471,820 | B2 | 6/2013 | Holman et al. |
| 8,593,801 | B2 | 11/2013 | Minowa |
| 8,693,188 | B2 | 4/2014 | Holman et al. |
| 9,415,727 | B2 | 8/2016 | Koseki et al. |
| 2002/0089522 | A1 | 7/2002 | Wu |
| 2004/0201595 | A1 | 10/2004 | Manchester |
| 2005/0041379 | A1 * | 2/2005 | Jang .................... F16M 11/046 361/679.27 |
| 2005/0107137 | A1 | 5/2005 | Byun et al. |
| 2005/0205731 | A1 * | 9/2005 | Shimizu ............... F16M 11/105 248/176.3 |
| 2006/0007644 | A1 | 1/2006 | Huilgol et al. |
| 2006/0030381 | A1 | 2/2006 | Byun et al. |
| 2006/0033847 | A1 | 2/2006 | Kim |
| 2006/0175476 | A1 * | 8/2006 | Hasegawa ............. F16M 11/28 248/125.1 |
| 2006/0219849 | A1 * | 10/2006 | Chiu .................... F16M 11/24 248/125.8 |
| 2006/0223596 | A1 | 10/2006 | Hur |
| 2007/0064379 | A1 * | 3/2007 | Shin .................... F16M 11/105 361/679.06 |
| 2007/0066363 | A1 | 3/2007 | Zhu et al. |
| 2007/0242820 | A1 | 10/2007 | Tseng |
| 2007/0262210 | A1 * | 11/2007 | Oh ........................ F16M 11/28 248/125.1 |
| 2007/0293283 | A1 | 12/2007 | Inubushi et al. |
| 2008/0064452 | A1 | 3/2008 | Kim et al. |
| 2008/0081591 | A1 | 4/2008 | Kim et al. |
| 2008/0096619 | A1 | 4/2008 | Kuga et al. |
| 2008/0192166 | A1 | 8/2008 | Wong et al. |
| 2009/0036181 | A1 | 2/2009 | Lee |
| 2009/0066031 | A1 | 3/2009 | Mcray et al. |
| 2009/0179133 | A1 * | 7/2009 | Gan ....................... F16M 11/24 248/422 |
| 2009/0237420 | A1 | 9/2009 | Lawrenz |
| 2009/0242722 | A1 * | 10/2009 | Lee ..................... F16M 11/2021 248/371 |
| 2009/0278006 | A1 | 11/2009 | Park et al. |
| 2010/0178963 | A1 | 7/2010 | Iwaki |
| 2010/0197372 | A1 | 8/2010 | Takagi et al. |
| 2010/0216512 | A1 | 8/2010 | Aghaei et al. |
| 2010/0248796 | A1 | 9/2010 | Higashigawa et al. |
| 2013/0147847 | A1 | 6/2013 | Koseki et al. |
| 2013/0286049 | A1 | 10/2013 | Yang et al. |
| 2015/0211675 | A1 * | 7/2015 | Shyu ..................... F16M 11/105 248/125.7 |
| 2016/0041582 | A1 | 2/2016 | Kim et al. |
| 2016/0071241 | A1 | 3/2016 | Karunamuni et al. |
| 2016/0123691 | A1 | 5/2016 | Gaubert et al. |
| 2016/0236359 | A1 | 8/2016 | Song et al. |
| 2017/0303415 | A1 | 10/2017 | Deily et al. |
| 2018/0124361 | A1 | 5/2018 | Simon |
| 2018/0124363 | A1 | 5/2018 | Flessas |
| 2019/0033989 | A1 | 1/2019 | Wang et al. |
| 2019/0064993 | A1 | 2/2019 | Hardie-bick |
| 2019/0317549 | A1 | 10/2019 | Gurr et al. |
| 2019/0318710 | A1 | 10/2019 | Gurr et al. |

FOREIGN PATENT DOCUMENTS

| | | |
|---|---|---|
| CN | 102767678 A | 11/2012 |
| CN | 103475823 A | 12/2013 |
| CN | 104394452 A | 3/2015 |
| JP | 2012039241 A | 2/2012 |
| JP | 2017161714 A | 9/2017 |
| KR | 100802384 B1 | 2/2008 |

OTHER PUBLICATIONS

"International Search Report & Written Opinion Issued in PCT Application No. PCT/US19/025090", dated May 17, 2019, 11 Pages.

"Non Final Office Action Issued in U.S. Appl. No. 15/953,122", dated Mar. 26, 2020, 23 Pages.

"Final Office Action Issued in U.S. Appl. No. 15/953,122", dated Oct. 10, 2019, 22 Pages.

"Non Final Office Action Issued in U.S. Appl. No. 15/953,122", dated Apr. 5, 2019, 18 Pages.

"International Search Report & Written Opinion Issued in PCT Application No. PCT/US2019/025091", dated Jul. 3, 2019, 16 Pages.

"International Search Report and Written Opinion Issued in PCT Patent Application No. PCT/US19/024167", dated Jul. 17, 2019, 11 Pages.

"Final Office Action Issued in U.S. Appl. No. 15/953,110", dated Aug. 7, 2019, 17 Pages.

"Non Final Office Action Issued in U.S. Appl. No. 16/458,677", dated Jun. 2, 2020, 16 Pages.

"Non Final Office Action Issued in U.S. Appl. No. 15/953,110", dated Jan. 28, 2019, 14 Pages.

"Applicant Initiated Interview Summary Issued in U.S. Appl. No. 15/953,122", dated Jul. 2, 2020, 3 Pages.

"International Search Report and Written Opinion Issued in PCT Application No. PCT/US20/031388", dated Aug. 28, 2020, 12 Pages.

"Final Office Action Issued in U.S. Appl. No. 15/953,122", dated Sep. 24, 2020, 27 Pages.

Levitt, David, "Invisibility Achieved Through iPad 2 App", Retrieved from: https://web.archive.org/web/20110626193644/https://www.prweb.com/releases/2011/6/prweb8591829.htm, Jun. 22, 2011, 3 Pages.

"Final Office Action Issued in U.S. Appl. No. 16/458,677", dated Nov. 9, 2020, 17 Pages.

* cited by examiner

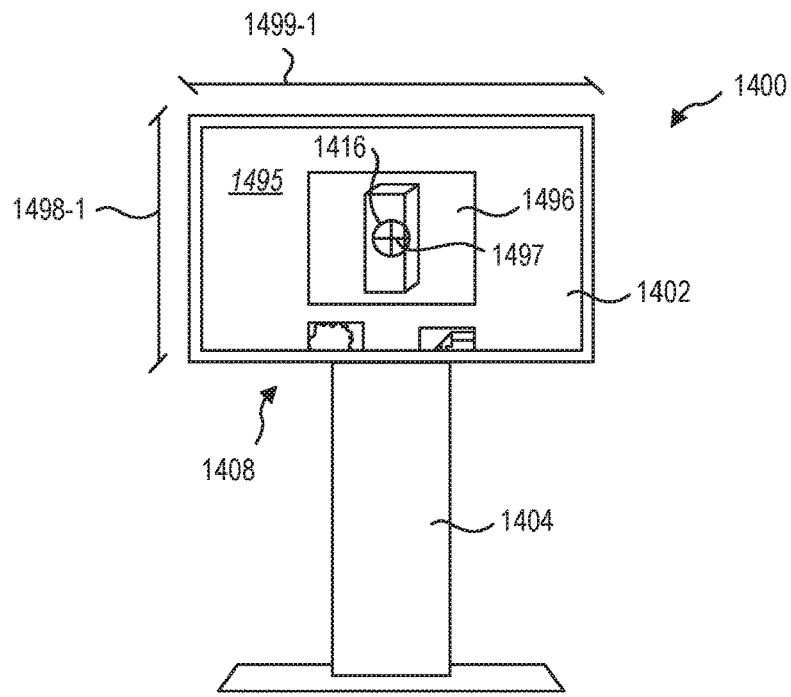
FIG. 22-1
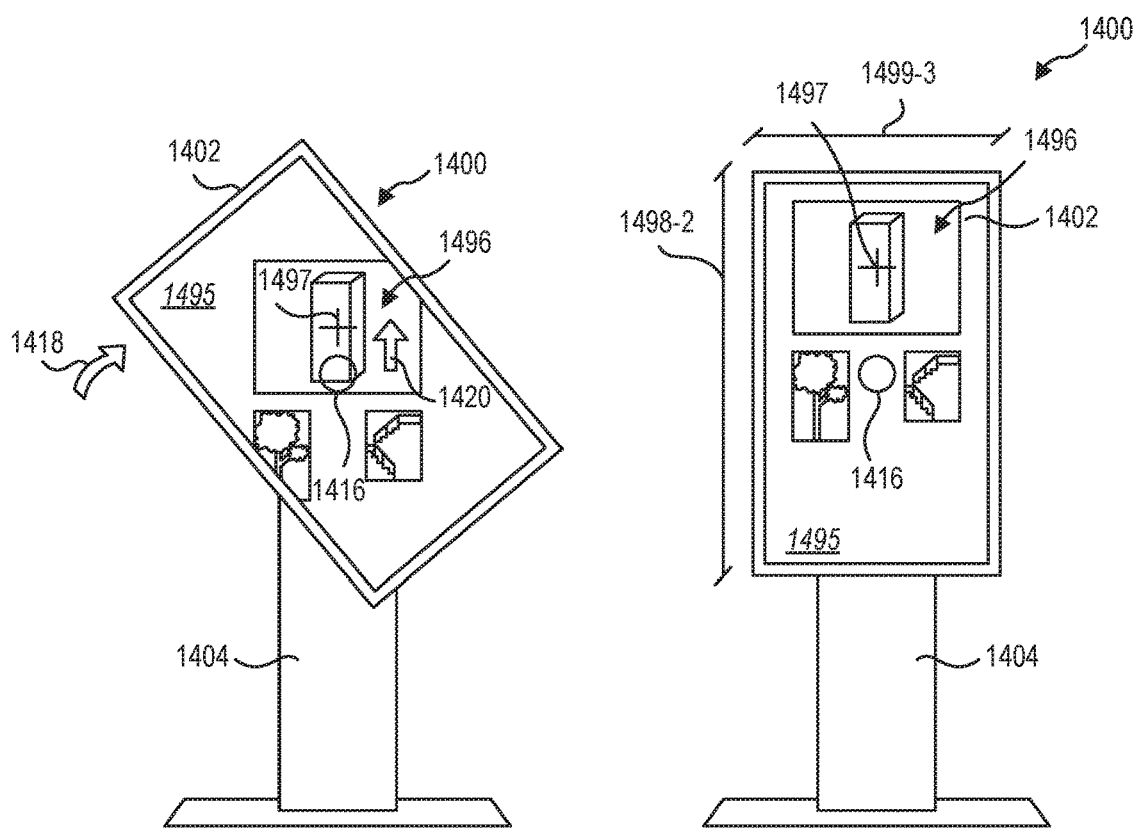
FIG. 22-2
FIG. 22-3

SYSTEMS AND METHODS OF PROVIDING A MULTIPOSITIONAL DISPLAY

BACKGROUND

Background and Relevant Art

Computing devices are becoming hubs for business meetings, planning, designing, and communications. Collaborative work on conventional computing devices has been limited, however. Conventional computing devices are primarily designed for a single-user to interact with the computing device at a time. The input devices and display of a conventional computing device typically do not facilitate collaborative work around a single computing device.

Recent large format computing devices have larger displays and allow input and viewing by more than one user at a time. Collaborative computing devices and other computing devices allow for communication between groups of users, for example, in a business meeting. The collaborative computing device allow for users to interact with other, remote users through the large format display.

However, interaction with other users and presentation and input to the computing device commonly use different orientations or formats for the display and/or computing device. Interacting with a remote user, for example, in a web-conference is more natural when the display is oriented vertically allowing a majority of the user's body to be present in the frame. Presenting information from a website or in an application presentation (e.g., a slideshow) to local users may be more intuitive and comfortable with the display is oriented horizontally allowing more information to be visible to the room.

Moving a large format display or other computing device between a vertical orientation and a horizontal orientation on a conventional display support may be cumbersome, hazardous, or require multiple adjustments to the display support that interrupts the user experience or limits functionality of the device.

The subject matter claimed herein is not limited to implementations that solve any disadvantages or that operate only in environments such as those described above. Rather, this background is only provided to illustrate one exemplary technology area where some implementations described herein may be practiced.

BRIEF SUMMARY

In one implementation, a device for supporting an electronic display includes a base, a display mount having a first position and a second position relative to the base, and a connection mechanism positioned between the base and the display mount. The connection mechanism is configured to rotate and translate the display mount from the first position to the second position according to a torque curve. The torque curve includes a discovery stage adjacent the first position, an initiation stage rotationally after the discovery stage, and an approach stage rotationally after the initiation stage. The connection mechanism applies a force toward the first position in the discovery stage. The connection mechanism having an initiation force applied toward the first position that is greater than the force in the discovery stage. The approach stage having an approach force applied toward the second position.

In another implementation, a device for supporting an electronic display includes a base, a display mount having a first position and a second position relative to the base, and a connection mechanism positioned between the base and the display mount. The connection mechanism is configured to rotate and translate the display mount from the first position to the second position according to a torque curve. The torque curve includes applying an initiation force toward the first position in a first half of the torque curve and applying an approach force toward the second position in a second half of the torque curve. The device further includes a dampening device providing dampening during rotation of the connection mechanism between the first position and the second position.

In a further implementation, a device for supporting an electronic display includes a base, a display mount having a first position and a second position relative to the base, and a connection mechanism positioned between the base and the display mount. The connection mechanism is configured to rotate and translate the display mount from the first position to the second position according to a torque curve. The torque curve includes a discovery stage adjacent the first position, and initiation stage rotationally after the discovery stage, and a balanced stage rotationally after the initiation stage. The connection mechanism applies a force toward the first position in the discovery stage. The connection mechanism applies an initiation force greater than the force of the discovery stage in the initiation stage. The initiation force is applied toward the first position. The connection mechanism applies no net force in the balanced stage.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIG. 1-2 is a side view of the implementation of a display system of FIG. 1-1;

FIG. 1-3 is a front view of the implementation of a display system of FIG. 1-1 in a first position;

FIG. 1-4 is a front view of the implementation of a display system of FIG. 1-1 in an intermediate position;

FIG. 1-5 is a front view of the implementation of a display system of FIG. 1-1 in a second position;

FIG. 2-1 is a front view of another implementation of a display system;

FIG. 2-2 is a front view of the implementation of a display system of FIG. 2-1 in a first position;

FIG. 2-3 is a front view of the implementation of a display system of FIG. 2-1 in an intermediate position;

FIG. 2-4 is a front view of the implementation of a display system of FIG. 2-1 in a second position;

FIG. 3 is an example torque curve of an implementation of a connection mechanism;

FIG. 4 is an example torque curve of another implementation of a connection mechanism;

FIG. 5 is an example torque curve of yet another implementation of a connection mechanism;

FIG. 8-1 is a rear view of an implementation of a display system in a first position;

FIG. 8-2 is a rear view of the implementation of a display system of FIG. 8-1 in a second position;

FIG. 9-1 is a rear view of another implementation of a display system in a first position;

FIG. 9-2 is a rear view of the implementation of a display system of FIG. 9-1 in a second position;

FIG. 12-1 is a rear view of an implementation of a connection mechanism in a first position;

FIG. 12-2 is a schematic representation of the connection mechanism of FIG. 12-1 in a first position;

FIG. 12-3 is a schematic representation of the connection mechanism of FIG. 12-1 between a first position and a second position;

FIG. 12-4 is a schematic representation of the connection mechanism of FIG. 12-1 in a second position;

FIG. 13-1 is a rear view of a rack-and-pinion implementation of a connection mechanism in a second position;

FIG. 13-2 is a rear view of a rack-and-pinion implementation of a connection mechanism in a first position;

FIG. 20-1 is an example of a display image on a display in a first position;

FIG. 20-2 is an example of the display image on a display of FIG. 20-1 in an intermediate position;

FIG. 20-3 is an example of the display image on a display of FIG. 20-1 in a second position;

FIG. 21-1 is a front view of an implementation of a display system having a plurality of orienting devices in a first position;

FIG. 21-2 is a front view of the implementation of a display system of FIG. 21-1 in a second position;

FIG. 22-1 is an example of a display image on a display system in a first position;

FIG. 22-2 is an example of the display image on a display system of FIG. 22-1 in an intermediate position; and FIG. 22-3 is an example of the display image on a display of FIG. 22-1 in a second position.

DETAILED DESCRIPTION

Figure 1:
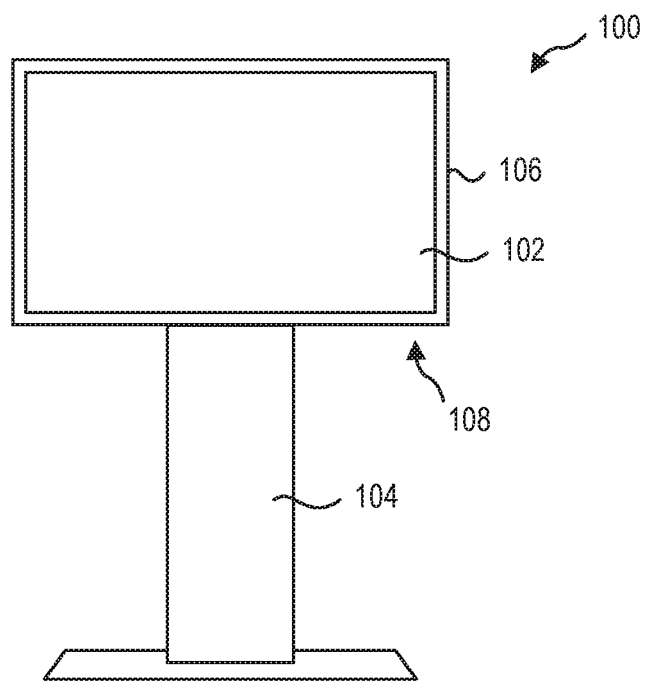
FIG. 1-1 is a front view of an implementation of a display system.

This disclosure generally relates to computing devices, support devices, support systems, and methods of use. More particularly, this disclosure generally relates to displays and/or computing devices supported by a stand having a movable connection. In some implementations, a display of a computing device according to the present disclosure may be rotatable relative to a support base. The display may translate relative to the support base during the rotation. For example, the movable connection may couple the rotational movement and the translational movement of the display such that a pivot point of the connection may translate during rotation of the display about the pivot point. In at least one example, a user rotating the display between a horizontal orientation (i.e., landscape orientation) and a vertical orientation (i.e., portrait orientation) may rotated the display through a 90° rotation while the origin or centerpoint of the display mount translates at least 10 mm.

In some implementations, the rotation and translation of the display relative to the base may be dampened during the movement. For example, the dampening may be a constant dampening through the range of motion of the connection mechanism. In other examples, the dampening may vary in the range of motion. In at least one example, the dampening may have a local maximum near a stable position (e.g., a horizontal orientation or a vertical orientation) that limits and/or prevents sudden movement of the display, while allowing faster movement thereafter toward another stable position with greater dampening upon approaching the second stable position.

In some implementations, the rotation and translation of the display relative to the base may be counterbalanced during the movement. For example, the translation component of the movement between a first position and a second position may include moving the mass of the display and/or display mount relative to gravity. The counterbalance force may offset the weight of the display, allowing movement between the first position and the second position with the same application of force, irrespective of the direction of movement.

In some implementations, the connection mechanism may apply a torque and/or force between the base and the display. For example, a connection mechanism may have one or more devices that apply a force against the direction of movement to limit or prevent the display shifting from a stable position. In other examples, the connection mechanism may apply a force between two stable positions to urge the display toward one of the two stable positions. In other words, the display system may be bistable in a first position and a second position with any orientation of the display therebetween being unstable and migrating to one of the first position or second position.

In some implementations, the display and computing device may be combined, such that the computing device rotates as the display rotates. For example, the display supported by the base and connection mechanism may be an all-in-one computing device in which substantially all computing components of the computing device are contained within the movable housing. In other implementations, the display may rotate while the computing device remains stationary. For example, the display may be supported contained in a movable housing supported by the connection mechanism and base, while other components of the computing device may be located on the base or remotely while in data communication with the display.

In some implementations, the display may include an accelerometer, gyroscope, camera, or other device that measures the orientation and/or position of the display and may detect movement of the display. For example, an accelerometer may measure the direction of gravitational acceleration and provide the computing device with an orientation and/or position relative to gravity. In other examples, a gyroscope may measure deflection (i.e., rotation) from a known position and provide the computing device with an orientation and/or position relative to the known position. In yet other examples, a camera may identify one or more objects or features in a surrounding environment of the display and provide the computing device with an orientation and/or position relative to the environment. In at least one example, an orienting device may measure the position of the base relative to the display, allowing the computing device to extrapolate environmental references based on assumptions of the positioning of the base (such as the base being positioned on a horizontal floor).

In some implementations, visual information shown on the display may be oriented relative to a constant external reference frame and irrespective of the orientation of the display. For example, visual information on the display may be displayed according to a reference frame fixed relative to gravity. As the display rotates and/or translates, the virtual reference frame may rotate and translate such that the external reference frame (from a perspective of a user) may remain constant and the visual information may rotate and/or translate in real time relative to the display. The visual information may remain oriented in a constant external reference frame relative to a user, the base, the environment, gravity, or other reference objects or directions. The visual information that is located in a portion of the display that is present in both the first position and the second position may be displayed in substantially the same location relative to the user. Moving the display may "create" or "remove" additional display space that may be rendered in real time, such that the display appears to a user as a "window" into a virtual and/or remote environment.

FIG. 1-1 is a front view of an implementation of a display system 100 according to the present disclosure. The display system 100 may include a display 102 and a base 104, where the display 102 is movable relative to the base 104. The display 102 may be in data communication with a computing device 108 that provides visual information to the display 102, which the display 102, in turn, presents to a user. In some implementations, the display 102 may be an all-in-one computing device 108 in which components of the computing device 108 are contained in a shared housing 106 with the display. For example, the display 102 may share a housing 106 with components including a microprocessor, such as a CPU, a GPU, a physics processor, or other general or dedicated microprocessor; system memory, such as RAM, graphics RAM, or other system memory; a hardware storage device (which may have instructions thereon that include one or more methods described herein), such as a platen-based storage device, a solid state storage device, or other non-transitory or long-term storage device; a communication device (e.g., communication by WIFI, BLUETOOTH, Ethernet, or other wired or wireless communication methods); input devices, such as a touch-sensing device, stylus, trackpad, trackball, gesture recognition device, cameras, or other input devices; one or more thermal management devices, such as fans, heat-transfer pipes or fins, liquid cooling conduits, or other thermal management devices; audio devices, such as speakers or audio output connections; power supplies, such as batteries, convertors, or wired power supply units that may be connected to a local electricity grid; or other components of the computing device 108.

In at least one example, the display 102 may be a touch-sensing display that allows users to directly interact with the display 102 and/or visual information presented on the display 102. The display 102 may be a light emitting diode (LED) display, an organic light emitting diode (LED) display, a liquid crystal display (LCD) monitor, or other type of display.

Figures 1, 2:
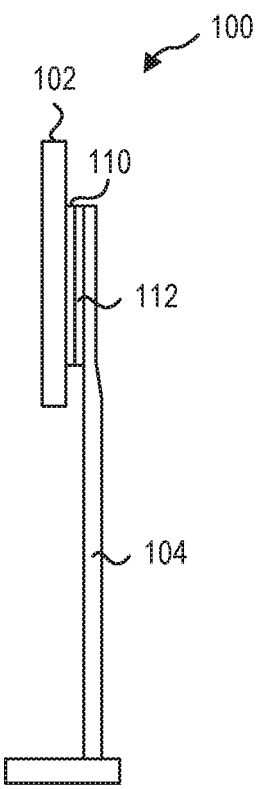

FIG. 1-2 is a side view of the implementation of the display system 100 described in relation to FIG. 1-1. The display system 100 may include a display mount 110 that connects the display 102 to a connection mechanism 112 positioned between the base 104 and the display 102/display mount 110. The connection mechanism 112 may include one or more devices that allow the rotation and/or translation of the display 102 and/or display mount 110 relative to the base 104.

As shown in FIG. 1-2, some implementations of the display system 100 may have a base 104 that is configured to support the display 102 above the ground, a floor, or other horizontal surface. For example, the display system 100 may be positioned on the floor of an office or positioned on an entertainment center. In other examples, the display system 100 may be positioned on a rolling cart to allow the display system 100 to be easily moved between rooms in an office. In other implementations, the base 104 may be a plate that is connectable to a vertical surface, such as a wall, inside a cabinet, to another vertical support (such as on a rolling cart) or other vertical surface that may support the mass of the display system 100. In yet other implementations, the base 104 may support the display 102 in a non-vertical position. For example, the base 104 may be an easel that supports the display 102 at a non-perpendicular angle to the ground. In some examples, the base 104 may be adjustable.

Figures 1, 2, 3:
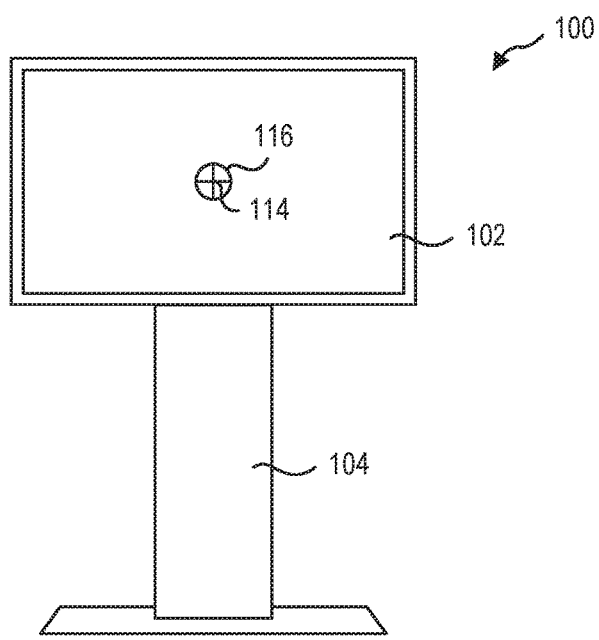

FIG. 1-3 through FIG. 1-5 illustrate an implementation of moving the display system 100 between a first position and a second position. FIG. 1-3 is a front view of the display system 100 in a first position with the display 102 in a landscape orientation relative to the base 104. FIG. 1-3 illustrates an initial centerpoint 114 of the display 102 in the first position for reference coinciding with the pivot point 116 of the display 102 as the display 102 moves. While FIG. 1-3 illustrates the first position as being a horizontal, landscape orientation of the display 102, it should be understood that the first position may be any orientation of the display 102 including horizontal, vertical, or any orientation therebetween.

FIG. 1-4 illustrates the display system 100 between the first position and a second position. The display 102 may rotate as a force or torque is applied to a portion of the display 102. A user may rotate the display 102 relative to the base 104 by applying a force to the display 102 manually (e.g., with the user's hand) or by actuating one or more electric, mechanical, or another powered assist. In some implementations, at least a portion of the force may be pneumatic, hydraulic, electrical, mechanical, magnetic, or other mechanism.

During the rotation 118 of the display 102, the display 102 may experience a translation 120. For example, the pivot point 116 of the display 102 may translate relative to the initial centerpoint 114 of the display 102 in the first position. As shown in FIG. 1-5, the pivot point 116 of the display 102 may continue to translate relative to the initial centerpoint 114 throughout the rotation of the display 102. In other examples, the pivot point 116 may translate relative to the initial centerpoint 114 during only a portion of the rotation. In at least one example, the pivot point 116 may be stationary relative to the initial centerpoint 114 during a first 45° of rotation and may translate relative to the initial centerpoint 114 during a second 45° of rotation. FIG. 1-5 illustrates an example of a second position of the display system 100 in which the display 102 is oriented in a vertical position (i.e., portrait orientation) relative to the base 104. While FIG. 1-5 illustrates the first position as being a vertical, portrait orientation of the display 102, it should be understood that the second position may be any orientation of the display 102 including horizontal, vertical, or any orientation therebetween that is different from the first position.

Similarly, while FIG. 1-3 through FIG. 1-5 illustrate approximately a 90° rotation of the display 102 from the first position to the second position, the movement between the first position and second position may include any amount of rotation, such as 45°, 90°, 180°, 270°, 360°, or other orientations. For example, a display 102 that with a rectangular aspect ratio may offer different viewing modes when rotated 90° between the first position and second position. However, a display 102 with a square aspect ratio, or a display that is non-orthogonal, may offer different or useful viewing modes when rotate at other angles relative to the base.

The pivot point 116 of the display 102 may translate relative to an initial centerpoint 114 during a first 90° of rotation (i.e., between the first position and the second position) a translation distance 122 that may be vertical, horizontal, or any direction therebetween relative to the base 104. In some implementations, the translation distance 122 may be in a range having an upper value, a lower value, or upper and lower values including any of 10 millimeters (mm), 15 mm, 20 mm, 25 mm, 30 mm, 40 mm, 50 mm, 60 mm, 70 mm, 80 mm, 90 mm, 100 mm, 125 mm, 150 mm, 200 mm, 250 mm, 300 mm, or any values therebetween. For example, the translation distance 122 may be greater than 10 mm. In other examples, the translation distance 122 may be less than 300 mm. In yet other examples, the translation distance 122 may be between 10 mm and 300 mm. In further examples, the translation distance 122 may be between 20 mm and 200 mm. In yet further examples, the translation distance 122 may be between 50 mm and 150 mm. In at least one example, the translation distance 122 may be about 100 mm.

Translating the display 102 during rotation may allow a user to access more of the display 102 in the portrait orientation. For example, a large format display may be positioned at eye-level for easy viewing in landscape mode. When rotated into portrait orientation, a portion of the display 102 may be positioned too high for a user to access or comfortably access to interact with a touch-sensing display or using a stylus. Additionally, video conferencing may be more natural to a user when a display 102 is oriented in portrait mode to show a larger proportion of a second user's body, as opposed to remaining positioned at eye-level of the user with a portion of the display 102 presenting the ceiling of the remote location. In other words, a greater proportion of the display 102 may be utilized for interaction in portrait orientation with translation than without translation.

In order to facilitate movement of the display between the first position and the second position in an efficient and safe manner, the connection mechanism that connects the display mount to the base may have one or more mechanical linkages, dampening device, counterbalance devices, or other components that assist and/or resist the rotation and/or translation of the display at different positions in the range of motion.

In some implementations, movement of the display system 100 between the first position and the second position may require a maximum torque in a range having an upper value or upper and lower values including any of 4.0 pound-feet (5.4 Newton-meters) of torque, 6.0 pound-feet (8.1 Newton-meters) of torque, 8.0 pound-feet (10.8 Newton-meters) of torque, 10 pound-feet (13.6 Newton-meters) of torque, 12 pound-feet (16.3 Newton-meters) of torque, 15 pound-feet (20.3 Newton-meters) of torque, 20 pound-feet (27.1 Newton-meters) of torque, 30 pound-feet (40.7 Newton-meters) of torque, 40 pound-feet (54.2 Newton-meters) of torque, or any values therebetween. For example, the movement of the display system 100 between the first position and the second position may require a maximum torque less than 40 pound-feet (54.2 Newton-meters). In other examples, the movement of the display system 100 between the first position and the second position may require a maximum torque less than 30 pound-feet (40.7 Newton-meters). In yet other examples, the movement of the display system 100 between the first position and the second position may require a maximum torque less than 20 pound-feet (27.1 Newton-meters). In further examples, the movement of the display system 100 between the first position and the second position may require a maximum torque less than 10 pound-feet (13.6 Newton-meters). In at least one example, the movement of the display system 100 between the first position and the second position may be performed by an elderly user using only one hand.

FIG. 2-1 through 2-4 illustrate another implement of a display system 200 with a stationary pivot point that is offset (e.g., at an angle) from the centerpoint of the display 202. FIG. 2-1 is a side view illustrating a structure of an implementation of the display system 200. As described herein, the display 202 may be in communication with a computing device 208 that is outside of the housing 206 of the display 202. In the illustrated implementation, the display 202 is movable relative to the computing device 208 by the connection mechanism 212 positioned therebetween. The computing device 208 may be fixed (e.g., rotationally fixed) to the base 204 and remain stationary while the display 202 moves between the first position and second position.

FIG. 2-2 is a is a front view of the display system 200 in a first position with the display 202 in a landscape orientation relative to the base 204. FIG. 2-2 illustrates an initial centerpoint 214 of the display 202 in the first position offset from a pivot point 216 of the display 202 as the display 202 moves. For example, as shown the pivot point 216 may be rotationally offset at an angle from the initial centerpoint 214. The angle may be 30°, 45°, 60°, or any angle that provides the desired rotation and/or translation of the pivot point 216. While FIG. 2-2 illustrates the first position as being a horizontal, landscape orientation of the display 202, it should be understood that the first position may be any orientation of the display 202 including horizontal, vertical, or any orientation therebetween.

FIG. 2-3 illustrates the display system 200 between the first position and a second position during rotation 218. The display 202 may rotate as a force or torque is applied to a portion of the display 202. A user may rotate the display 202 relative to the base 204 by applying a force to the display 202 manually (e.g., with the user's hand) or by actuating one or more electric, mechanical, or another powered assist. In some implementations, at least a portion of the force may be pneumatic, hydraulic, electrical, mechanical, magnetic, or other mechanism.

The display 202 may rotate about the pivot point 216 to translate the translated centerpoint 214-2 from the initial centerpoint 214-1. The translation 220 may follow an arcuate path 221. In some implementations, the arcuate path 221 may have a constant radius (e.g., may be a segment of a circular path). In other implementations, the arcuate path 221 may be a curved path that is non-circular. For example, the arcuate path 221 may be a portion of an ellipse or other exponential curve.

Figures 1, 2, 3, 4:
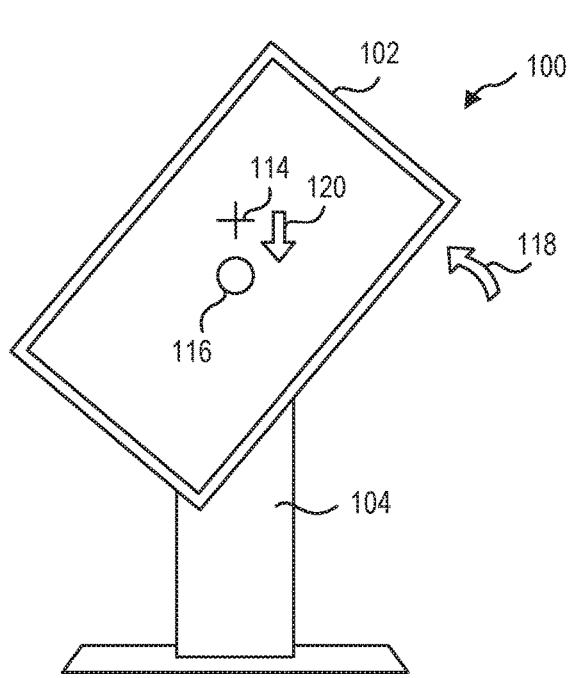

FIG. 2-4 shows the display system 200 in the second position. The pivot point 216 of the display 202 may remain stationary relative to the base 204 throughout the rotation of the display 202 while the translated centerpoint 214-2 of the display 202 moves in the arcuate path 221. While FIG. 2-4 illustrates the first position as being a vertical, portrait orientation of the display 202, it should be understood that the second position may be any orientation of the display 202 including horizontal, vertical, or any orientation therebetween that is different from the first position.

The translated centerpoint 214-2 of the display 202 may translate relative to an initial centerpoint 214-1 during the rotation (i.e., between the first position and the second position) a translation distance 222 that may be vertical, horizontal, or any direction therebetween relative to the initial centerpoint 214-1 and/or base 204. In some implementations, the translation distance 222 may be in a range having an upper value, a lower value, or upper and lower values including any of 10 millimeters (mm), 15 mm, 20 mm, 25 mm, 30 mm, 40 mm, 50 mm, 60 mm, 70 mm, 80 mm, 90 mm, 100 mm, 125 mm, 150 mm, 200 mm, 250 mm, 300 mm, or any values therebetween. For example, the translation distance 222 may be greater than 10 mm. In other examples, the translation distance 222 may be less than 300 mm. In yet other examples, the translation distance 222 may be between 10 mm and 300 mm. In further examples, the translation distance 222 may be between 20 mm and 200 mm. In yet further examples, the translation distance 222 may be between 50 mm and 150 mm. In at least one example, the translation distance may be about 100 mm.

Figures 1, 2, 3, 4, 5:
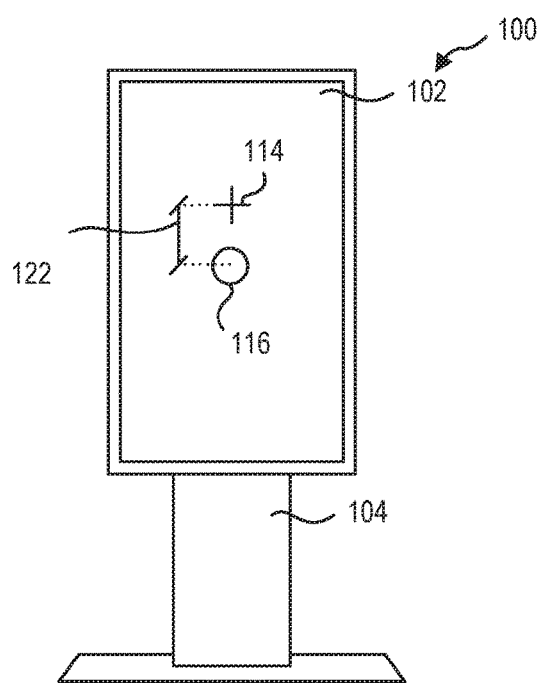
Figures 1, 2:
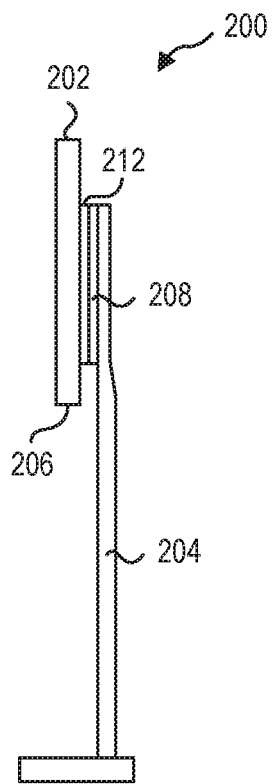
Figure 2:
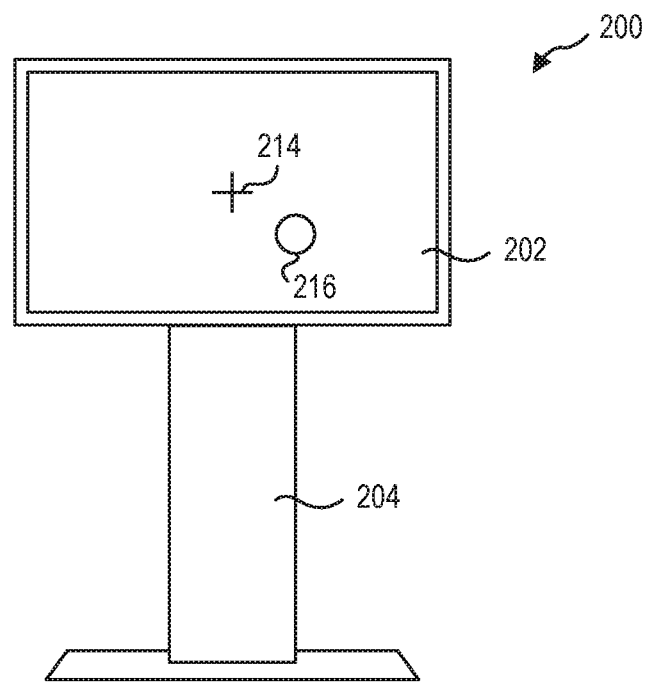
Figures 2, 3:
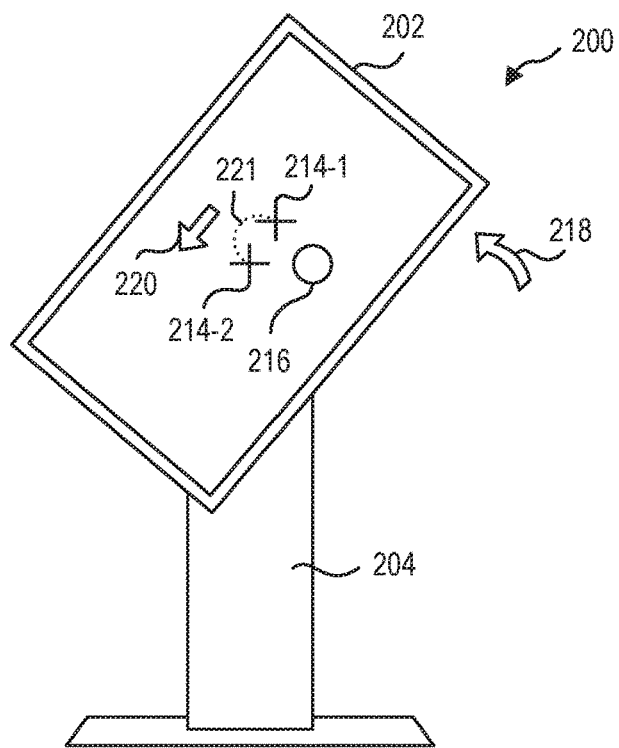
Figures 2, 3, 4:
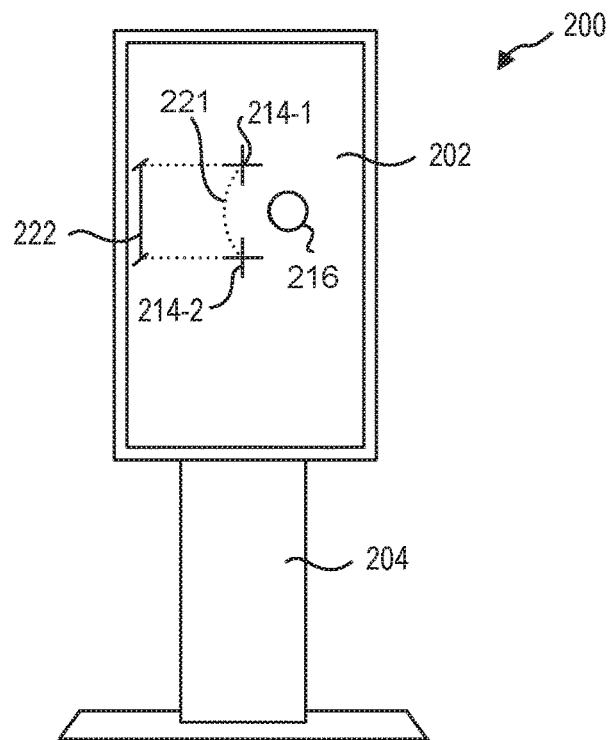
Figure 3:
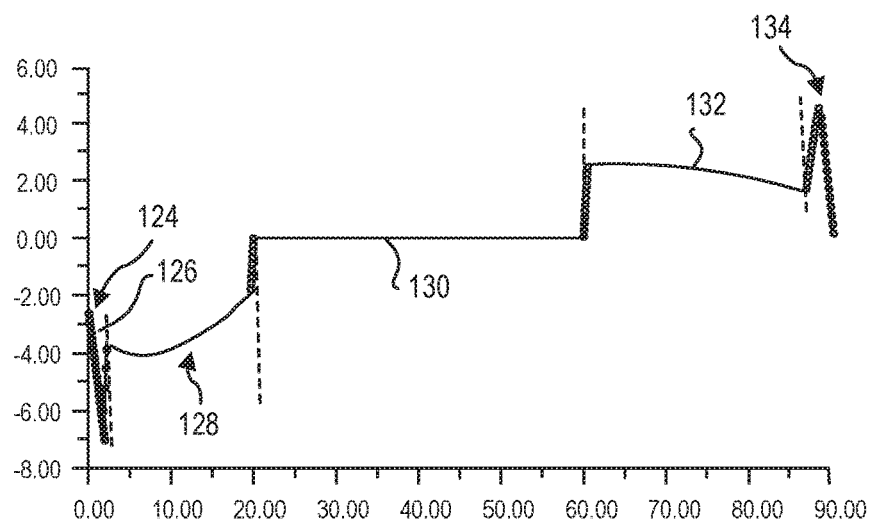
Figure 4:
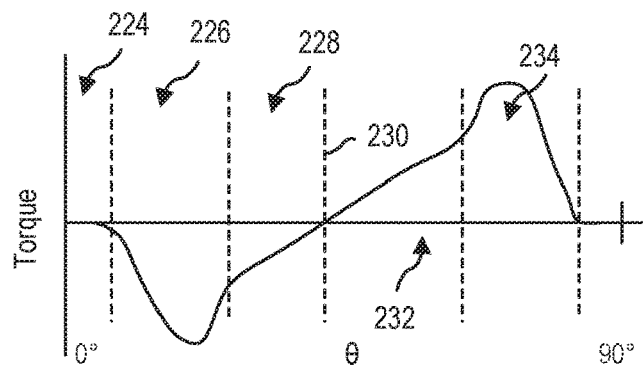
Figure 5:
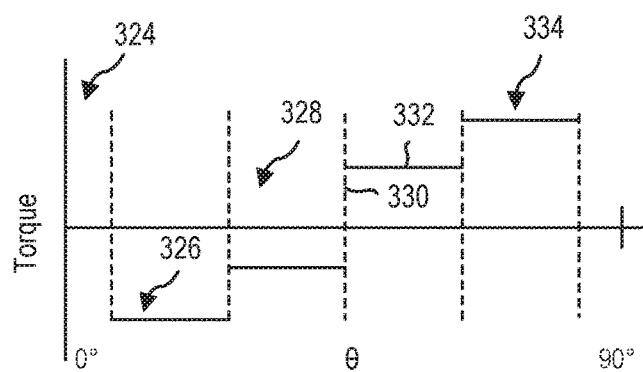

FIG. 3 through FIG. 5 are example implementations of a torque curve of a connection mechanism that is positioned between and connects the display mount to the base. The torque curve may reflect the resistance and/or assistance a user experiences while attempting to move the display between the first position and the second position relative to the base. In some implementations, the torque curve may be approximately the same moving from the first position to the second position and moving from the second position to the first position. In other words, the connection mechanism may provide the same amount of resistance and/or assistance in the same angular locations in either rotational direction. For example, the connection mechanism may include a counterbalance device that applies a force opposing the force of gravity of the display and display mount to assist translating the display and display mount vertically upward. The result of the counterbalance device may be an approximately equal amount of force needed to translate the display vertically upwards or downwards.

In other implementations, a connection mechanism may have a first torque curve moving from the first position to the second position and a different, second torque curve moving from the second position to the first position. For example, the connection mechanism may lack a counterbalance device, such that more force is needed to translate the display and display mount vertically upward than downward. In other examples, a connection mechanism with a first torque curve may resist counterclockwise rotation of the display through the first 10° of rotation from the first position and may assist rotation (e.g., rotate on its own) after the first 10° of rotation for a remaining 80° of counterclockwise rotation to the second position. The connection mechanism with a second torque curve may resist clockwise rotation of the display through the first 10° of rotation from the second position and may assist rotation (e.g., rotate on its own) after the first 10° of rotation for a remaining 80° of clockwise rotation when returning to the first position.

FIG. 3 illustrates a torque curve that is similar in either rotational direction (e.g., from a 0° orientation toward a 90° orientation, or from the 90° orientation toward the 0° orientation). In some implementations, the torque curve may exhibit similar but not identical behavior in either rotational direction due to differences in spring rates and/or orientation of the application of force to the connection mechanism in each rotational direction. For example, the torque curve of FIG. 3 includes similar zones or stages, while the magnitude of force applied in those zones or stages may be difference. In other implementations, the torque curve may be different in each rotational direction (e.g., from a 0° orientation toward a 90° orientation, and from the 90° orientation toward the 0° orientation). For example, the display system may have resist movement away from whichever position in which the display begins; the direction of the torque of the connection mechanism may be based upon the position of the display. In at least one example, the torque curve may resist movement from the landscape orientation (e.g., apply a force resisting the rotation and translation away from the landscape orientation) and may continue to resist that movement throughout the entire rotation to the portrait orientation. Upon reaching the portrait orientation, the torque curve of the connection mechanism may change, resisting movement from the portrait orientation (e.g., apply a force resisting the rotation and translation away from the portrait orientation) and may continue to resist that movement throughout the entire rotation back to the landscape orientation.

In some implementations, the torque curve may have different operating regions or stages, such that the connection mechanism applies a different torque or otherwise functions differently at different rotational positions between the first position and the second position. For example, FIG. 3 illustrates a torque curve with a discovery stage 124 immediately adjacent the first position at 0° orientation. The connection mechanism may generate relatively little torque in the discovery stage 124, such that a user may move the display easily within the discovery stage 124 to "discover" the movable nature of the display organically during interaction with the display. The discovery stage 124 may abut a hard stop of the rotation, such that the system "allows" rotation with little resistance in a first rotation direction and prevents rotation in the opposing second rotational direction. For example, the discovery stage 124 may have an angular width of less than 5°, less than 3°, less than 2°, or less than 1° from the end of the rotational range of motion. This allows a user to "discover" the rotational direction organically through interaction with the display system.

Following the discovery stage 124 as the display moves toward the second position, an initiation stage 126 of the torque curve may include the connection mechanism generating a higher level of torque to resist the display moving from the first position. The initiation stage 126 may limit or prevent a user accidentally or unintentionally moving the display from the first position during use. The initiation stage 126 may allow the display to be stable in the first position until the torque of the initiation stage 126 is overcome. In other words, a user may move the display through the discovery stage 124 and partially into the initiation stage 126 when, upon releasing the display in the initiation stage 126, the torque applied by the connection mechanism may return the display to the first position.

In some implementations, the initiation stage 126 may have an angular width having an upper value, a lower value, or an upper and lower value including any of 1°, 2°, 5°, 10°, 15°, or any values therebetween. For example, the initiation stage 126 may have an angular width greater than 1°. In other examples, the initiation stage 126 may have an angular width less than 15°. In yet other examples, the initiation stage 126 may have an angular width between 1° and 15°. In further examples, the initiation stage 126 may have an angular width less than 10°. In yet further examples, the initiation stage 126 may have an angular width about 5°. In at least one example, the initiation stage 126 may be within 45° of the first position.

The initiation stage 126 may provide a local maximum of torque against the rotational movement of the display to ensure the rotation of the display by a user is intentional. Upon overcoming the relatively high torque of the initiation stage 126, a resistance stage 128 may follow. The resistance stage 128 of the torque curve may apply a torque to the display to resist the rotational movement of the display. However, the torque of the resistance stage 128 may be less than that of the initiation stage 126. For example, the user may experience the initiation stage 126 as a resistance to a movement of the display, but upon overcoming the initiation stage 126, the lower torque of resistance stage 128 may communicate to a user that the display is designed to continue rotating. In other words, continued high resistance of the initiation stage 126 may be understood by a user to indicate that the user is "forcing the rotation" of the display, while a reduction in the torque through the resistance stage 128 may encourage a user to continue rotating the display.

Similar to the initiation stage 126, the resistance stage 128 may allow the display to be stable in the first position until the torque of the resistance stage 128 is overcome. In other words, a user may move the display through the discovery stage 124, the initiation stage 126, and partially into the resistance stage 128 when, upon releasing the display in the resistance stage 128, the torque applied by the connection mechanism may return the display to the first position through resistance stage 128, the initiation stage 126, and the discovery stage 124.

In some implementations, the resistance stage 128 may have an angular width having an upper value, a lower value, or an upper and lower value including any of 1°, 2°, 5°, 10°, 15°, 20°, 30°, 40°, or any values therebetween. For example, the resistance stage 128 may have an angular width greater than 1°. In other examples, the resistance stage 128 may have an angular width less than 40°. In yet other examples, the resistance stage 128 may have an angular width between 1° and 40°. In further examples, the resistance stage 128 may have an angular width less than 20°. In at least one example, the resistance stage 128 may have an angular width about 18°.

A balanced stage 130 of the torque curve may rotationally follow the resistance stage 128 (e.g., may occur after rotating the display through the resistance stage 128 toward the second position) and provide a location or range of locations in the torque curve in which the display system is balanced (i.e., torque is approximately zero). For example, the display and/or connection mechanism may remain stationary when a user force or other outside force is removed from the display system in the balanced stage 130. In other words, when in the balanced stage 130, the user can remove the user's hands from the display and the display will remain in the partially rotated position between the first position and the second position.

In some implementations, the balanced stage 130 may be an unstable equilibrium point, such that the display system is bistable in either the first position or the second position. In other implementations, such as that with the torque curve shown in FIG. 3, the balanced stage 130 may have an angular width having an upper value, a lower value, or an upper and lower value including any of 1°, 2°, 5°, 10°, 15°, 20°, 30°, 40°, 50°, 60°, 70°, or any values therebetween. For example, the balanced stage 130 may have an angular width greater than 1°. In other examples, the balanced stage 130 may have an angular width less than 70°. In yet other examples, the balanced stage 130 may have an angular width between 1° and 70°. In further examples, the balanced stage 130 may have an angular width less than 45°. In at least one example, the balanced width may have an angular width about 40°.

The torque curve may include additional stages with a torque in the opposite direction after the balanced stage 130. For example, the torque curve may have at least one stage in which a torque is applied in the direction of the rotation to urge the rotation toward the second position. FIG. 3 illustrates an approach stage 132 and a homing stage 134. The approach stage 132 and homing stage 134 may, collectively or individually, be a "pull-in" stage. The pull-in stage is any stage of the torque curve in which the rotation of the display is assisted by the connection mechanism to approach a destination position. In other words, when rotating the display from the first position to the second position, as shown in FIG. 3, the connection mechanism may provide a torque against the user's force in the initiation 124 and resistance stage 128 and may provide a torque assisting the user's force in the approach stage 132 and homing stage 134 to urge the display toward the second position.

The approach stage 132 may assist the rotation of the display toward the destination position (i.e., the second position in FIG. 3) in a controlled manner. For example, the connection mechanism may provide a torque in the direction of the rotation approach stage 132 such that a user may stop applying a force to the display, and the display may continue to rotate toward the second position. In some implementations, the approach stage 132 may have an angular width having an upper value, a lower value, or an upper and lower value including any of 1°, 2°, 5°, 10°, 15°, 20°, 30°, 40°, or any values therebetween. For example, the approach stage 132 may have an angular width greater than 1°. In other examples, the approach stage 132 may have an angular width less than 40°. In yet other examples, the approach stage 132 may have an angular width between 1° and 40°. In further examples, the approach stage 132 may have an angular width less than 20°. In at least one example, the approach stage 132 may have an angular width about 26°.

The homing stage 134 may have a greater torque than the approach stage 132. In some implementations, the homing stage 134 may assist the rotation of the display toward the destination position (i.e., the second position in FIG. 3) by urging the display toward the destination position with additional torque relative to the approach stage 132. For example, the connection mechanism may provide a torque in the direction of the rotation in the approach stage 132 to continue rotating the display toward the second position, and the homing stage 134 may urge the display with additional torque in the direction of the destination to provide feedback to the user (tactilely and visually), that the display has completed rotation to the second position. In some implementations, the homing stage 134 may have an angular width having an upper value, a lower value, or an upper and lower value including any of 1°, 2°, 5°, 10°, or any values therebetween. For example, the homing stage 134 may have an angular width greater than 1°. In other examples, the homing stage 134 may have an angular width less than 10°. In yet other examples, the homing stage 134 may have an angular width between 1° and 10°. In further examples, the homing stage 134 may have an angular width less than 5°. In at least one example, the homing stage 134 may have an angular width about 3°.

The approach stage 132 and homing stage 134 may be the opposing direction counterparts to the resistance stage 128 and initiation stage 126, respectively. For example, the torque curve of FIG. 3 is described from the perspective of the display rotating from the first position to the second position. When rotating the display from the second position to the first position (i.e., experiencing the torque curve of FIG. 3 from the right to the left), the homing stage 134 may function as and/or may be an initiation stage in the direction of the first position and the approach stage 132 may function as and/or may be a resistance stage. As a user rotates the display through the balanced stage 130 toward the first position (moving along the torque curve to the left), the resistance stage 128 and initiation stage 126 may function as pull-in stages to assist rotating the display to the first position. As such, the resistance stage 128 may function as and/or may be an approach stage in the direction of the first position and the initiation stage 126 may function as and/or may be a homing stage.

FIG. 4 illustrates another implementation of a torque curve of a connection mechanism. The torque curve may include a discovery stage 224 and initiation stage 226, similar to the torque curve described in relation to FIG. 3. In some implementations, the transitions between the stages of the torque curves may be discontinuous, such as shown in FIG. 3 and between the initiation stage 226 and resistance stage 238 of the torque curve of FIG. 4.

In other implementations, the transitions between the stages of the torque curves may be continuous such that the torque curve is continuous. For example, the resistance stage 228 and approach stage 232 may have a continuous and/or linear relationship such that the balanced stage 230 of the torque curve may be a single point.

FIG. 4 further illustrates an example of a torque curve that is symmetrical. For example, the torque curve of the connection mechanism is identical whether the user is moving the display from the first position to the second position or the second position to the first position. In other words, a homing stage 234 is symmetrical with the initiation stage 226.

In yet other implementations, at least one of the stages of the torque curve may include a discrete non-zero torque value through the stage. For example, FIG. 5 illustrates and an implementation of a torque curve with a constant torque provided by the connection mechanism in each of the stages. The discovery stage 324, for example, may have a constant zero torque until the initiation stage 326 that has a maximum torque of the torque curve. The initiation stage 326 may be followed by a resistance stage 328 that may have a constant torque that is less than a maximum torque of the initiation stage 326. A balanced stage 330 may divide the resistance stage 328 from an approach stage 332. The approach stage 332 may be rotationally followed by a homing stage 334 that has a greater magnitude torque than the approach stage 332 to urge the display toward the second position.

In some implementations, the torque curve of the connection mechanism alone may be insufficient to provide a smooth and/or "weightless" feel to the display rotation for a user. For example, a torque curve that is symmetrical between the first position and the second position may produce an asymmetric performance due to the effect of gravity on the display system rotation. For example, the rotation of the display relative to the base may be linked to a translation distance through which the mass of the display moves. Therefore, the force of gravity may apply a torque to the display in a static condition.

Figure 6:
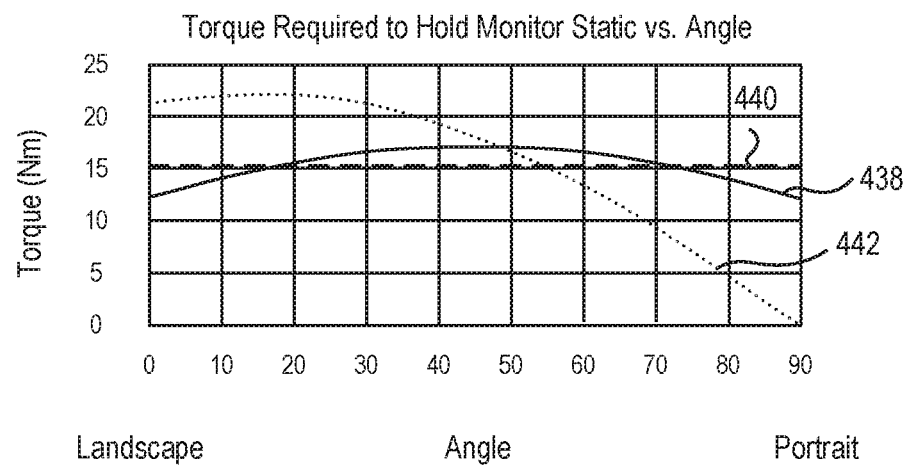
FIG. 6 is a graph comparing the torque to balance the gravitational moment of various implementations of a display system.

FIG. 6 is a graph illustrating example curves of the gravitational force to be counteracted in order to produce a final torque curve as described in relation to FIG. 3 through FIG. 5. The first curve 438 represents the effect of gravity on an implementation with an arcuate translational path, such as the implementation described in relation to FIG. 2-1 through FIG. 2-4. The second curve 440 and third curve 442 represent the effect of gravity on a system with a linear, vertical translational path, such as the implementation described in relation to FIG. 1-1 through FIG. 1-5.

More specifically, the second curve 440 illustrates a force curve of a simulated rack-and-pinion connection mechanism (which will be described in more detail in relation to FIG. 13-1 through FIG. 13-2). The rack-and-pinion connection mechanism directly converts translation and rotation, resulting in the constant, flat curve of the second curve 440. Irrespective of location between the first position and the second position, gravity may apply the same torque to the rack-and-pinion connection mechanism. The third curve 440 illustrates a force curve of a simulated drag link connection mechanism (which will be described in more detail in relation to FIGS. 8-1 and 8-2). The drag link implementation converts rotation to translation non-linearly, resulting in the non-linear and increasing force needed to balance the force of gravity represented in the third curve 442.

Figure 7:
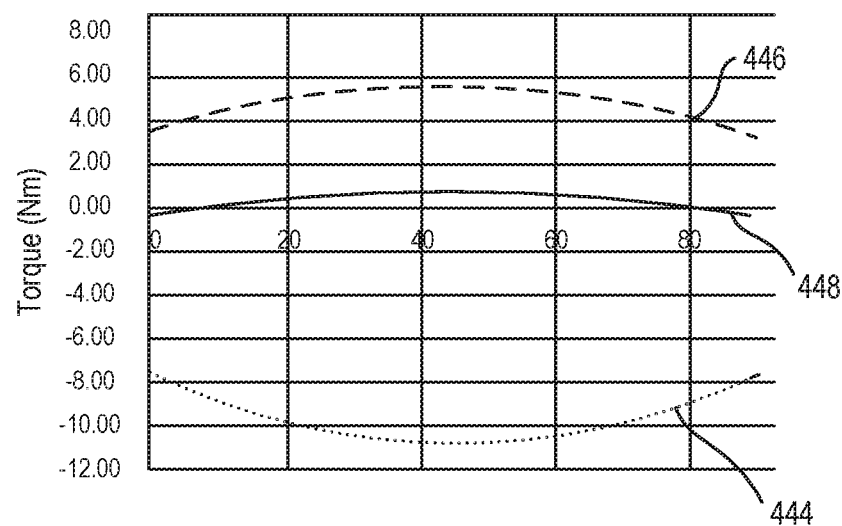
FIG. 7 is an example counterbalance force curve of an implementation of a display system.

In some implementations, a counterbalance device may be used in conjunction with the connection mechanism to approach a net-zero moment on the device. For example, FIG. 7 illustrates an example of a spring counterbalance device in an offset pivot point connection mechanism implementation. The first curve 444 is the gravitational moment curve of the display as the display pivots about the offset pivot point. For example, the gravitational moment is greatest when the rotation is 45°, resulting in the center of mass of the display being positioned directly horizontally to the pivot point (i.e., the lever arm is perpendicular to gravity).

The second curve 446 is the spring moment of the counterbalance device. The counterbalance device may include two springs, such that the combined spring moment of the two springs produce a counterbalance moment that sums with the gravitational moment to produce a net moment of the display that is less than 20% of the gravitational moment throughout the net moment curve 448. In other implementations, the counterbalance device may produce a counterbalance moment that sums with the gravitational moment to produce a net moment of the display that is less than 10% of the gravitational moment throughout the net moment curve 448. In yet other implementations, the counterbalance device may produce a counterbalance moment that sums with the gravitational moment to produce a net moment of the display that is less than 5% of the gravitational moment throughout the net moment curve 448.

Figures 1, 8:
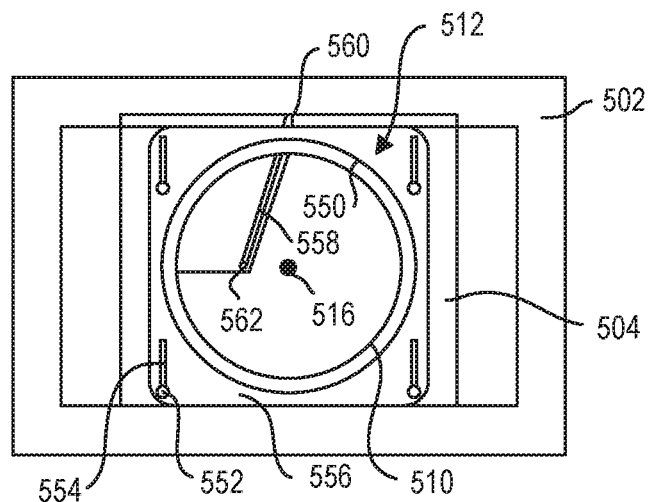
Figures 2, 8:
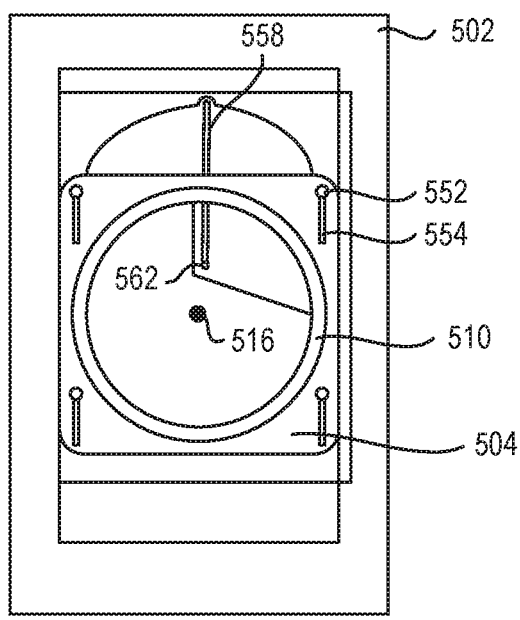

Various implementation of a display system and/or connection mechanism may exhibit the force curves and/or performance described herein. FIG. 8-1 through 12-4 may illustrate example implementations of connection mechanisms according to the present disclosure. FIG. 8-1 illustrates an implementation of a drag link connection mechanism 512, according to the present disclosure. The display 502 is shown in a landscape orientation relative to the base 504. As described herein, the base 504 may be a plate that is configured to attach to a wall or other stand.

The connection mechanism 512 may have a curved track 550 that may interact with the display 502 and/or display mount 510 to allow the rotation of the display 502 and/or display mount 510 relative to the base 504. The display 502 and/or display mount 510 may be translatable vertically relative to the base 504 through one or more posts 552 that interact with one or more complementary linear slots or grooves 554 in an intermediate member 556. The intermediate member 556 may include the curved track 550 and the linear slots or grooves 554, allowing the rotation of the display 502 and/or display mount 510 relative to the intermediate member 556 and the linear translation of the intermediate member 556 relative to the base 504. Therefore, the connection mechanism 512 may allow the rotation and the linear translation of the display 502 relative to the base 504.

The connection mechanism 512 may include a mechanical linkage that links the rotation of the display 502 and/or display mount 510 relative to the base 504 to the translation of the display 502 and/or display mount 510 relative to base 504. The mechanical linkage may include a drag link 558 that is connected to the base 504 at a first end 560 and to the display 502 and/or display mount 510 at a second end 562. The second end 562 may be offset from the pivot point 516 of the rotation of the display 502 and/or display mount 510. The drag link 558 may vertically support the display 502 and/or display mount 510 relative to the base 504.

Referring now to FIG. 8-2, as the display 502 and/or display mount 510 rotates toward the second position, the offset of the connection location of the second end 562 may cause the connection location of the second end 562 to rotate about the pivot point 516 as the display 502 and/or display mount 510 rotates about the pivot point 516. Because the drag link 558 supports the vertical position of the display 502 and/or display mount 510 relative to the base 504, moving the connection location of the second end 562 around the pivot point 516 may translate the display 502 and/or display mount 510 vertically as the one or more grooves 554 of the display 502 and/or display mount 510 slide past the one or more posts 552 of the base 504.

Figures 1, 9:
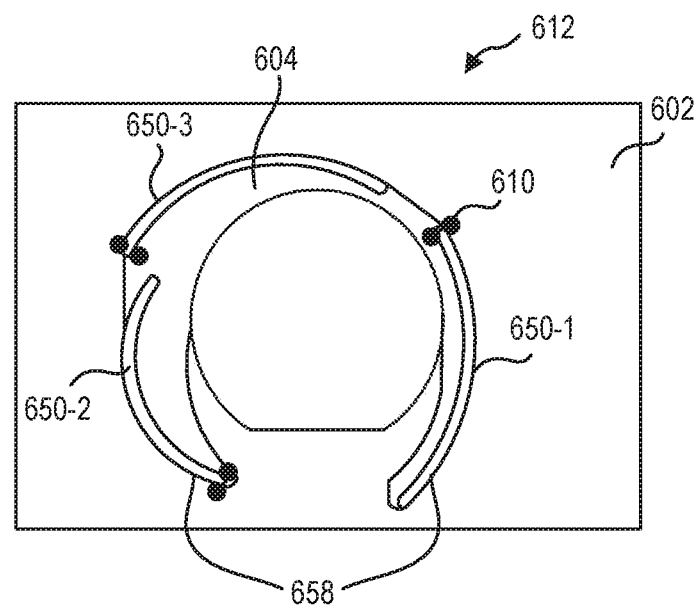
Figures 2, 9:
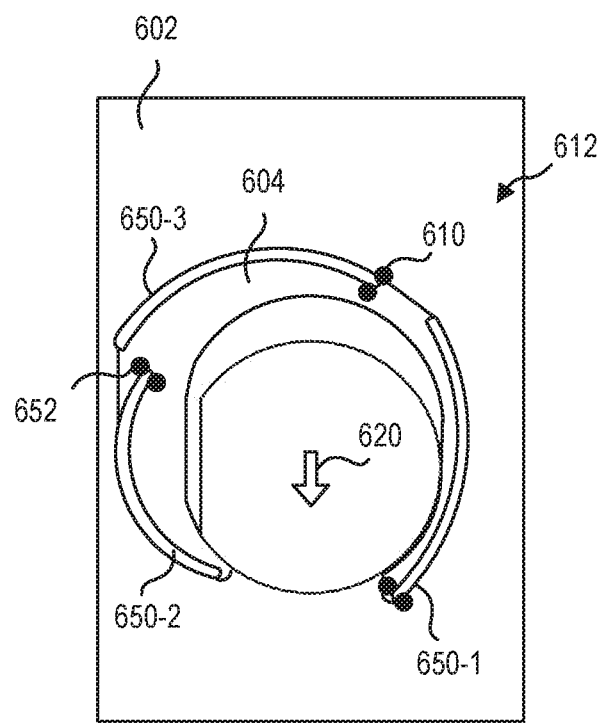

In other implementations, the mechanical linkage that converts rotational movement to translational movement may be integrated into one or more non-circular curved tracks. For example, FIGS. 9-1 and 9-2 illustrate an implementation of a connection mechanism 612 with a plurality of non-circular curved tracks 650-1, 650-2, 650-3 that function as the mechanical linkage 658 between the base 604 and the display 602 and/or display mount 610. In some implementations the connection mechanism 612 may include non-circular curved tracks 650-1, 650-2, 650-3 that, when engaged with a display 602 and/or display mount 610, may allow the display and/or display mount 610 to rotate relative to the base 604.

Circular curved tracks (such as curved track 550 described in relation to FIGS. 8-1 and 8-2), may allow rotation of the display and/or display mount around a pivot point that is fixed relative to the curved tracks. In other embodiments, circular curved tracks where each has a different radius of curvature, such as circular curved tracks 650-1, 650-2, 650-3 of FIGS. 9-1 and 9-2, may allow simultaneous rotation and translation of the display 602 and/or display mount 610. For example, the implementation of a connection mechanism 612 illustrated in FIGS. 9-1 and 9-2 has a display mount 610 that engages with each of the three non-circular curved tracks 650-1, 650-2, 650-3. As the display 602 and/or display mount 610 rotates, the three engagement points of the display mount 610 follow the different curves of the circular curved tracks 650-1, 650-2, 650-3. These engagement points may facilitate simultaneous rotation and translation of the display 602 and/or display mount 610.

FIG. 9-2 illustrates the display 602 and display mount 610 in a second position with the engagement points at an opposite end of the circular curved tracks 650-1, 650-2, 650-3 from the position shown in FIG. 9-1. The 90° rotation of the display 602 and display mount 610 relative to the circular curved tracks 650-1, 650-2, 650-3 may produce a translation 620 of the display 602 and display mount 610.

Figure 10:
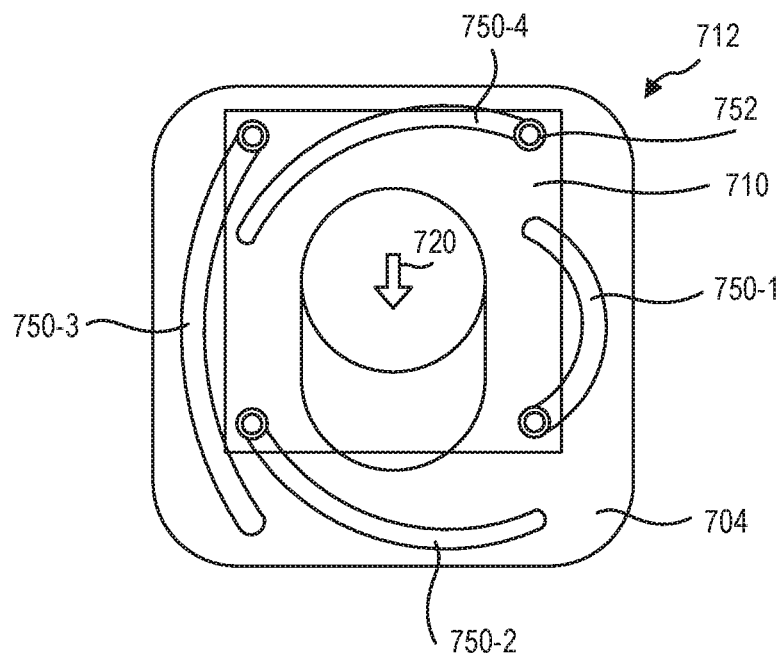
FIG. 10 is a rear view of an implementation of a connection mechanism of a display system in a first position.

FIG. 10 is a rear view of an implementation of a cycloid connection member 712 with four non-circular curved tracks 750-1, 750-2, 750-3, 750-4. A plurality of posts 752 may engage with the non-circular curved tracks 750-1, 750-2, 750-3, 750-4 to allow the rotation and translation of the display mount 710 relative to the base 704. While FIG. 10 illustrates the non-circular curved tracks 750-1, 750-2, 750-3, 750-4 positioned in the base 704 and the posts 752 fixed to the display mount 710, it should be understood that the connection mechanism 712 may be reversed such that the non-circular curved tracks 750-1, 750-2, 750-3, 750-4 are positioned in the display and/or display mount 710 and the posts 752 are fixed relative to the base 704.

The non-circular curved tracks 750-1, 750-2, 750-3, 750-4 may be configured to retain a constant special relationship of the posts 752. For example, the posts 752 may be fixed to the display mount 710 in a square. In other implementations, the posts 752 may be fixes to the display and/or display mount 710 in any arrangement capable of supporting the display and/or display mount 710. For example, the posts 752 may be arranged according to a standard (Video Electronics Standards Association) VESA Mounting Interface Standard positioning for a computer monitor or television. For example, the posts 752 may be arranged according to VESA MIS-B, -C, -D, -D 75 mm, -E, -F M6, -F M8, or other industry display mounting standards.

The translation 720 of the display and/or display mount 710 may occur by the lower relative positions of the opposite ends of each of the non-circular curved tracks 750-1, 750-2, 750-3, 750-4. For example, the first non-circular curved track 750-1 is opposite the third non-circular curved track 750-3 and shorter than the third non-circular curved track 750-3. Through a 90° rotation of the display mount 710 and posts 752, the display mount 710 ends in a vertically lower position than the first position shown in FIG. 10. Similarly, the second non-circular curved track 750-2 and fourth non-circular curved track 750-4 are positioned opposite one another. Both the second non-circular curved track 750-2 and fourth non-circular curved track 750-4 have a net decrease in vertical position from the first position to the second position. Therefore, a 90° of the display mount 710 and posts 752 may include a net downward translation 720 relative to the base 704.

Figure 11:
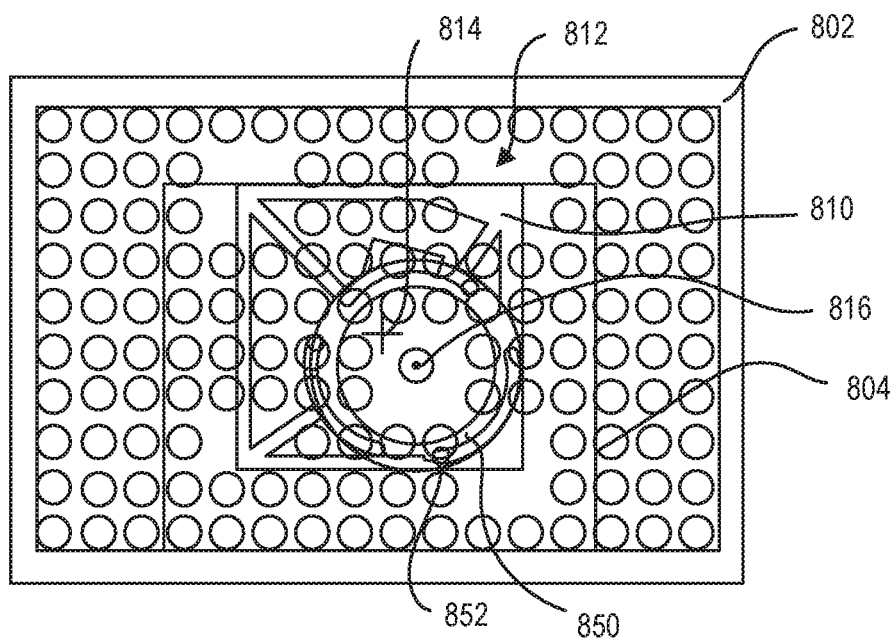
FIG. 11 is a rear view of a further implementation of a display system in a first position.

FIG. 11 is a rear view of an implementation of an offset pivot point connection mechanism 812 connecting a display 802 and display mount 810 to a base 804. The connection mechanism 812 may include a curved track 850 that engages with a plurality of posts 892 to allow rotation around the pivot point 816. In other implementations, the curved track 850 and posts 852 may be a single post 852 at the pivot point 816 that engages with a receiver to allow the connection mechanism to rotate about the pivot point 816. The curved track 850 and posts 852 may allow for greater torque, counterbalancing force, dampening force, or combinations thereof to be generated by the connection mechanism 812 in response to the movement of the display 802 and/or display mount 810 relative to the base 804.

In some implementations, the offset pivot point 816 may be offset from an origin 814 of the display 804 and/or display mount 801 at a 45° angle (relative to a vertical direction of the connection mechanism 812). While the offset pivot point 816 may be offset from an origin 814 of the display 804 and/or display mount 801 at other angles, a 45° angle for the offset allows a 90° rotation around the pivot point 816 with the origin 814 returning to a 45° relationship with the pivot point 816. At a 45° offset angle, the horizontal component of the offset may be the same after a 90° rotation, so that the first position and second position of the display 802 and/or display mount 810 are vertically aligned. Further, at a 45° offset angle, the translation distance (such as the translation distance 222 described in relation to FIG. 2-4) may be double the vertical component of the offset.

As described herein, some implementations of a connection mechanism may include a counterbalance device to apply a counterbalance force to counterbalance the vertical translation of the display and/or display mount relative to gravity. Some implementations of a connection mechanism may include a counterbalance device to apply a counterbalance force to counterbalance the vertical translation of the display and/or display mount relative to gravity. In some implementations, the counterbalance device may provide a counterbalance force that counterbalances at least 60% of a gravitational weight of the display and/or display mount. In other implementations, the counterbalance device may provide a counterbalance force that counterbalances at least 80% of a gravitational weight of the display and/or display mount. In yet other implementations, the counterbalance device may provide a counterbalance force that counterbalances at least 90% of a gravitational weight of the display and/or display mount. In yet other implementations, the counterbalance device may provide a counterbalance force that counterbalances at least 100% of a gravitational weight of the display and/or display mount.

In some implementations, the counterbalance device may apply a first counterbalance force when moving the display and display mount from the first position to the second position and an equal counterbalance force when moving the display and display mount from the second position to the first position. In other implementations, the counterbalance device may apply a first counterbalance force when moving the display and display mount from the first position to the second position and a second counterbalance force when moving the display and display mount from the second position to the first position, where the first counterbalance force and second counterbalance force are different.

Figures 1, 12:
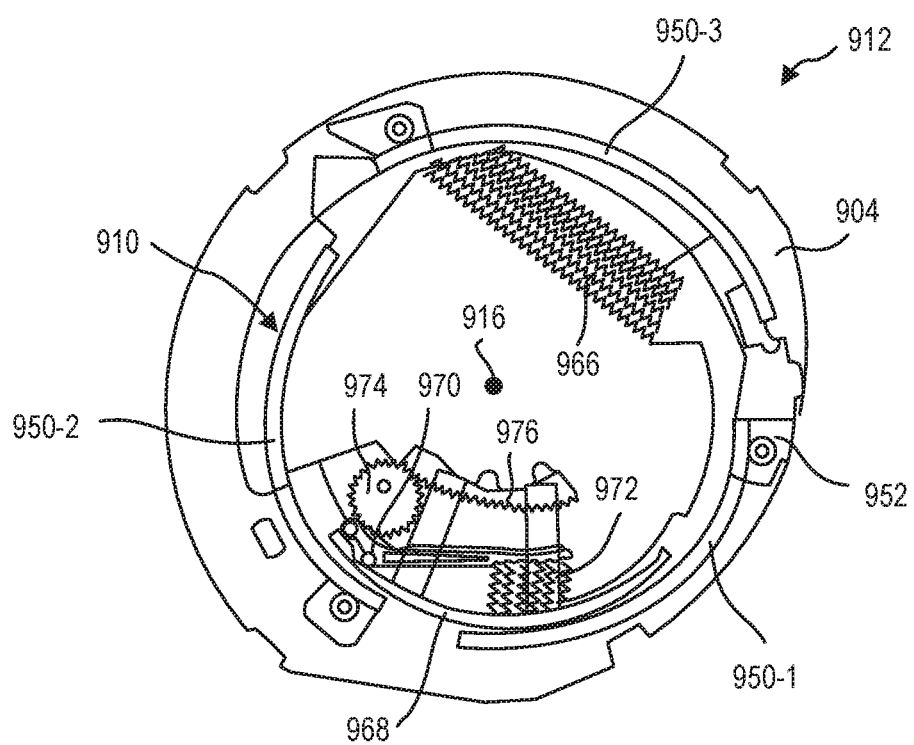
Figures 2, 12:
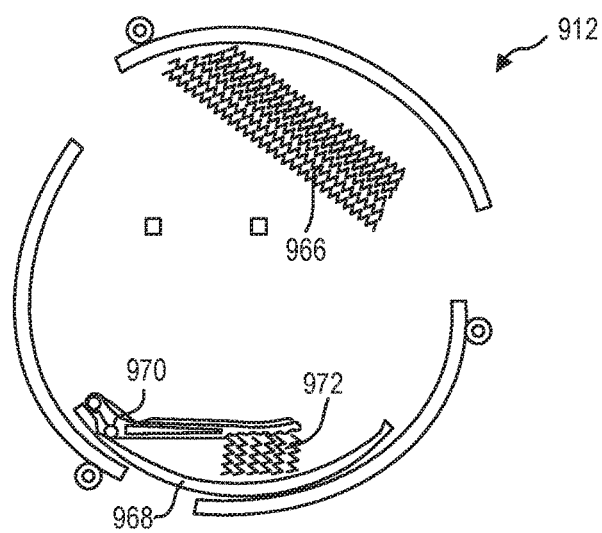
Figures 3, 12:
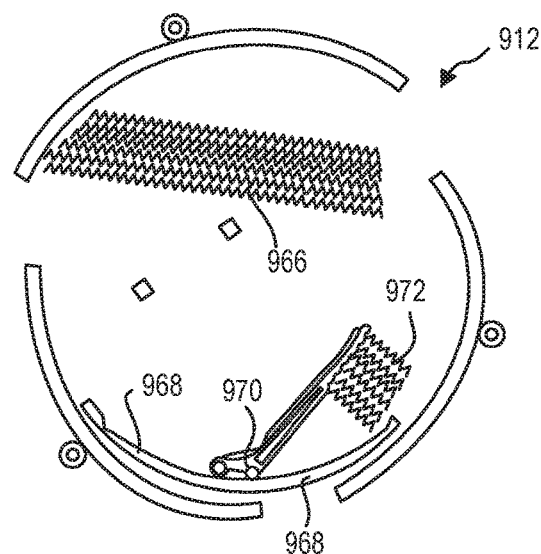
Figures 4, 12:
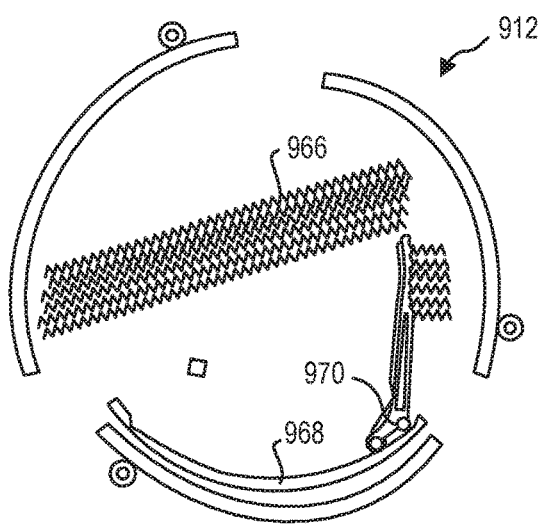

FIG. 12-1 through FIG. 12-4 illustrates a connection mechanism 912 with a counterbalance device 966 to provide a counterbalance force (such as described in relation to FIG. 6 and FIG. 7), a ramp profile 968 to create a torque curve (such as those described in relation to FIG. 3 through FIG. 5), and a dampening device 974 to limit the rotational rate of the connection mechanism 912 to increase safety and reliability of a display system.

FIG. 12-1 is a front view of an implementation of a connection mechanism 912 according to the present disclosure. The connection mechanism 912 may connect the display mount 910 or display to the base 904. The connection mechanism 912 includes a plurality of non-circular curved tracks 950-1, 950-2, 950-3 that engage with posts 952 to allow rotational and translational movement of the display mount 910 relative to the base 904, such as described in relation to FIG. 9-1 through FIG. 10.

The connection mechanism 912 may include a counterbalance device 966 that may apply a counterbalance force to the connection mechanism 912 to account for the gravitation weight of the display and display mount 910 such that the display and display mount 910 do not simply fall downward and rotate unintentionally. The counterbalance device 966 may include one or more springs, gears, resilient members, mechanical linkages, electric motors, levers, or other devices capable of providing a force in the connection mechanism 912 to limit the downward translation of a portion of the connection mechanism due to gravity. For example, the counterbalance device 966 may include one or more springs that may change in length due to relative rotation of a component of the connection mechanism relative to another component of the connection mechanism. A counterbalance device 966 including one spring may behave according to Hooke's Law, increasing the counterbalance force as the spring changes in length. A counterbalance device 966 including a plurality of springs, such as the implementation of FIG. 12-1, may have a more constant counterbalance force, as the plurality of springs may be staggered to change length at different rates as the connection mechanism 912 rotates.

In other implementations, the counterbalance device 966 may be an electric motor that resists rotation of the connection mechanism due to a translation force. For example, the electric motor may be actuated only by a pressure switch that is closed upon a user applying a torque to the display and/or display mount. In yet other implementations, the counterbalance device 966 may include one or more levers, gears or linkages to alter the rate at which the counterbalance force is applied to the connection mechanism.

In some implementations, a connection mechanism 912 may include a ramp profile 968 and bearing 970 that rolls along the ramp profile 968. The ramp profile 968 may define a profile relative to a pivot point 916 of the connection mechanism 912. The bearing 970 may roll along the ramp profile 968 under compression by a compression element 972, such as springs, pistons-and-cylinders, bushings, or other resilient and/or compressible members that apply a compressive force to the bearing 970. The bearing 970 may roll "down" the slope of the ramp profile 968 in different rotational directions and/or toward different ends of the ramp profile 968 depending upon the position of the bearing 970 on the ramp profile 968. For example, the ramp profile 968 may have a peak or plateau near or at the center that creates a balanced stage, such as that described in relation to the torque curves of FIG. 3 through FIG. 5. In other examples, the ramp profile 968 may have regions of greater slope near or at the ends of the ramp profile 968 such that the bearing 970 applies a greater torque to the connection mechanism 912, providing the initiation stage and/or homing stage of a torque curve. In yet other examples, the ramp profile 968 may be removable and/or interchangeable to allow different torque curves to be implemented using the same connection mechanism 912.

The connection mechanism 912 may further include a dampening device 974 that provides a dampening torque that is relative to the rate of movement of the connection mechanism 912. A dampening device 974 may increase the safety and/or reliability of a display system by limiting and/or preventing rotation and/or translation that is too fast.

In some implementations, the dampening device 974 may be a layer of grease positioned between components of the connection mechanism. In other implementations, the dampening device 974 may be a dampening motor that rotates as the connection mechanism 912 rotates. The dampening motor may have an internal friction that increases as the rotational rate of the dampening motor increases. While the response of the dampening motor may be constant relative to a constant rotational rate of the dampening motor, in some implementations, the rotational rate of the dampening motor may change even when the rotational rate of the connection mechanism is constant.

For example, the dampening device 974 may have a non-circular gear, or a circular gear with an offset rotational axis, that engages with a track 976 to turn the dampening motor at different rotational rates as the connection mechanism 912 rotates from a first position to the second position. The dampening device 974, therefore, may have a variable dampening curve through the rotational range of motion of the connection mechanism 912. For example, the dampening device 974 may provide additional dampening in the final 10°, 5°, 3°, or 1° of either end of the rotational range of motion of the connection mechanism 912. The increased dampening may reduce impact forces of the connection mechanism against a hard stop, increasing the operation lifetime of the connection mechanism and/or other components of a display system (such as the display or the computing device). The increased dampening may increase the safety of the display system by applying a greater dampening force to more aggressively limit the speed of the movement of the display system at the start of the rotation. Slower movement at the start of the rotation may make impacts of the display to the user or other users nearby less likely or less injurious.

In some implementations, the dampening device 974 may resist movement such that a maximum rotational rate of the connection mechanism without external force applied is less than 45° per second. In other implementations, the dampening device 974 may resist movement such that a maximum rotational rate of the connection mechanism without external force applied is less than 30° per second. In yet other implementations, the dampening device 974 may resist movement such that a maximum rotational rate of the connection mechanism without external force applied is less than 15° per second. In further implementations, the dampening device 974 may resist movement such that a maximum rotational rate of the connection mechanism without external force applied is less than 10° per second. In at least one implementation, the dampening device 974 may resist movement such that a maximum rotational rate of the connection mechanism without external force applied is less than 5° per second.

FIG. 12-2 illustrates the connection mechanism 912 of FIG. 12-1 in a first position. The counterbalance device 966 may be in a lowest energy state in the first position. In other words, the counterbalance device 966 may be applying the least amount of force to the connection mechanism 912 in the first position than in any position between the first position and the second position. The counterbalance device 966 may apply increasing amounts of counterbalance force as the connection mechanism 912 moves toward the second position and at least a portion of the connection mechanism and/or display translates downward.

In the first position, the bearing 970 may be positioned at a first end of the ramp profile 968, representing the initiation stage of the torque curve of the connection mechanism 912. The compression element 972 may be compressing the bearing 970 against the ramp profile 968. The bearing 970 may thereby resist rolling "up" the slope of the ramp profile 968, resisting the rotation of the connection mechanism 912 away from the stable first position.

FIG. 12-3 illustrates the connection mechanism 912 midway between the first position and the second position. The counterbalance device 966 is in a tensioned state and may be applying a greater counterbalance force to the connection mechanism 912 in FIG. 12-3 than in the lower energy state of the first position illustrated in FIG. 12-2. The bearing 970 is positioned in the center of the ramp profile 968 at a peak in the ramp profile 968; the bearing 970 is at an unstable equilibrium point, such as the balanced stage of the torque curve described in relation to FIG. 4. The connection mechanism 912 and the bearing 970 compressed against the ramp profile 968 by the compression element 972 may have been applying a torque to the connection mechanism 912 opposing the rotation of the display by the user through the first half of the ramp profile 968. Beyond the position shown in FIG. 12-3, the bearing 970 may apply a torque in the direction of rotation and toward the second end of the ramp profile. The bearing 970 may apply a pull-in force to the display after the position shown in FIG. 12-3.

FIG. 12-4 illustrates the connection mechanism 912 approaching the second position where the bearing 970 will be in a stable position at the second end of the ramp profile 968. The counterbalance device 966 may apply a greater force at or near the second position than at the first position to counterbalance the force of gravity during translation.

Figures 1, 13:
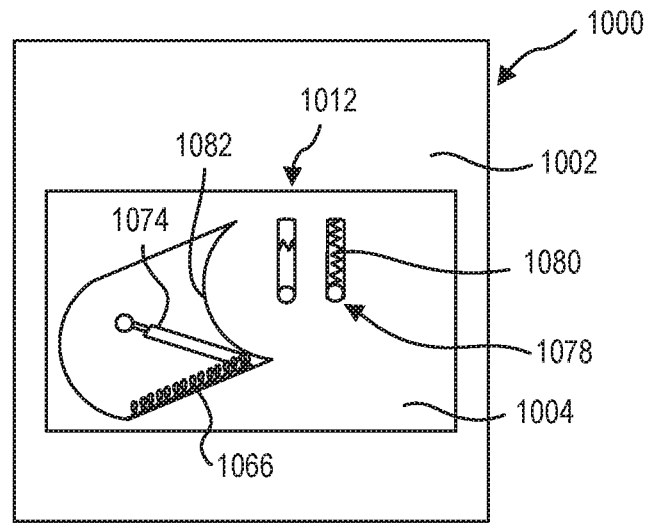
Figures 2, 13:
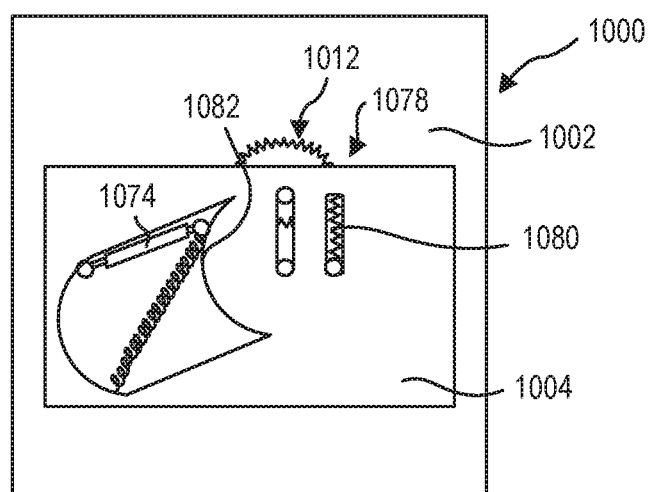

FIG. 13-1 and FIG. 13-2 illustrate yet another implementation of a display system with a connection mechanism 1012 that coupled rotational and translation movement of a display 1002 relative to a base 1004.

FIG. 13-1 is a rear view of a connection mechanism 1012 including a rack-and-pinion engagement to translate the display 102 relative to the base 1004 during rotation of the display 1002. In some implementations, a portion of the rack-and-pinion may be fixed relative to the display 1002. In such implementations, rotation of the display 1002 may provide a rotation of a portion of the pinion 1078 relative to the rack 1080, such that the display 1002 translates linearly relative to the rack 1080.

In some implementations, a counterbalance device 1066 may be fixed between the display 1002 and/or display mount and connection mechanism 1012 and/or base 1004. FIG. 13-1 illustrates the display system 1000 in a portrait orientation. In the present implementation, the counterbalance device 1066 may be compression spring that applies a compression or expansion force to urge the pinion 1078 upward on the rack 1080. In other implementations, the portrait orientation may be configured with the pinion 1078 at the top of the rack 1080, and the counterbalance device 1066 may be configured to support the display from "falling" into the landscape orientation.

In some implementations, the connection mechanism 1012 may include a dampening device 1074 that is a piston and cylinder, such as a shock absorber. The piston and cylinder may limit the rotational and/or translational speed of the connection mechanism 1012 by different amounts at different positions. For example, the curved surface 1082 that the dampening device 1074 follows as the connection mechanism moves from the first position shown in FIG. 13-1 to the second position shown in FIG. 13-2 may cause a faster linear displacement of the dampening device 1074 at the ends of the curved surface 1082 than in the center, resulting in greater dampening and speed limiting. In other words, because the dampening device 1074 resists motion based on the rate of change of the length of the dampening device 1074, the curved surface 1082 further increases the rate of change of the length of the dampening device 1074 at either end of the curved surface 1082, where the ends of the curved surface 1082 correspond to the first position and the second position of the display system 1000.

Figure 14:
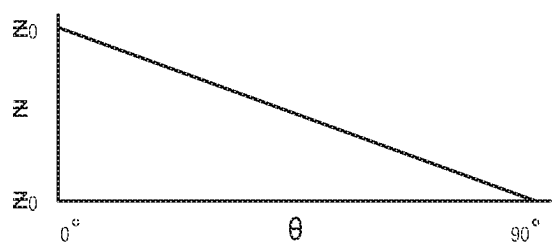
FIG. 14 is a graph illustrating an example conversion curve of rotational motion to translational motion.

As described herein, the translation and the rotation of the connection mechanism are coupled, such that when the display and/or display mount rotates relative to a base, the display and/or display mount translates relative to the base, as well. In some implementations, the rotation and the translation may have a linear relationship, such as illustrated in FIG. 14. The z-position (or other direction of the translation) may change linearly and constantly throughout the rotation of the connection mechanism. In other words, the connection mechanism may convert rotation of the display and/or display mount to translation of the display and/or display mount with a fixed coefficient or ratio.

FIG. 14 illustrates a linear relationship from 0° to 90°, but in other implementations, the rotational range may be more or less than 90°. In other implementations, the rotational range of the connection mechanism may be 90°, but the coupling of the rotation and translation may be linear for less than the full 90°. In yet other implementations, the coupling of the rotation and translation may be non-linear.

Figure 15:
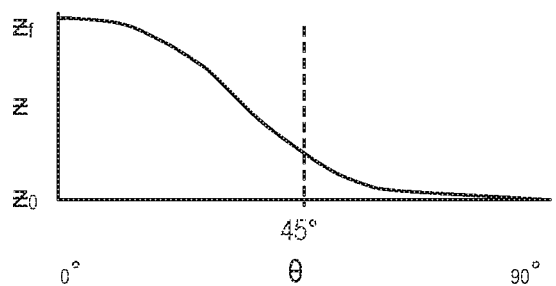
FIG. 15 is a graph illustrating another example conversion curve of rotational motion to translational motion.

For example, FIG. 15 illustrates another implementation of a conversion of rotation to translation. In the graph shown in FIG. 15, the rotation to translation conversion relationship is non-linear. In some implementations, the conversion relationship of the connection mechanism may be logarithmic, exponential, discontinuous, or another non-linear relationship. FIG. 15 further illustrates a conversion relationship that is asymmetrical. For example, a majority of the translation occurs prior to the 45° midpoint of the rotation. In such implementations, the translation may occur at different rates depending upon the direction of the rotation and the orientation of the display in the rotational range. For example, an offset pivot connection mechanism, such as described in relation to FIG. 2-1 through 2-4 may have a conversion relationship with lower translation ratios at or near the ends of the rotational range and a higher translation ratio at the center of the rotational range.

Figure 16:
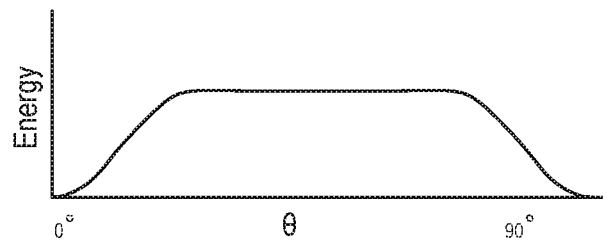
FIG. 16 is a graph illustrating an example potential energy curve of an implementation of a display system.

In some implementations, the connection mechanism may be bistable with a higher potential energy in the center of the rotational range. The stable positions at either end of the rotational range may be lower energy states that cause the system to remain in the first position or the second position until a user imparts energy to move the system. In some implementations, the energy curve of the connection mechanism may have a plateau, such that the system may remain stationary in a range of orientations between the first position (0° orientation) and the second position (90° orientation). For example, FIG. 16 illustrates an energy curve of an implementation of a connection mechanism that is flat from 30° to 60°. In other words, the connection mechanism and/or display system may be stable in orientations between 30° and 60°.

Figure 17:
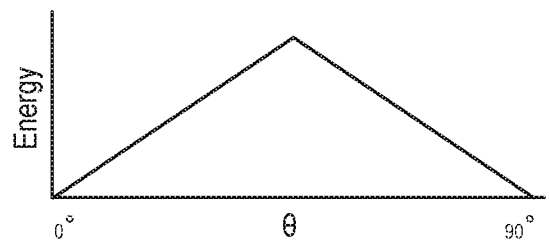
FIG. 17 is a graph illustrating another example potential energy curve of an implementation of a display system.

In other implementations, it may be beneficial to have the display system be stable only in specific user modes. For example, an implementation of the display system may only be stable in the portrait orientation and the landscape orientation. FIG. 17 illustrates an energy curve with no plateau or flat portion. Any orientation in which the display is between the 0° or the 90° position, the connection mechanism will rotate the display toward the lower energy states of the 0° position or the 90° position. In some implementations, the energy curve may be discontinuous, as shown in FIG. 17, while in other implementations, the energy curve may be continuous and lack a plateau or flat portion.

Figure 18:
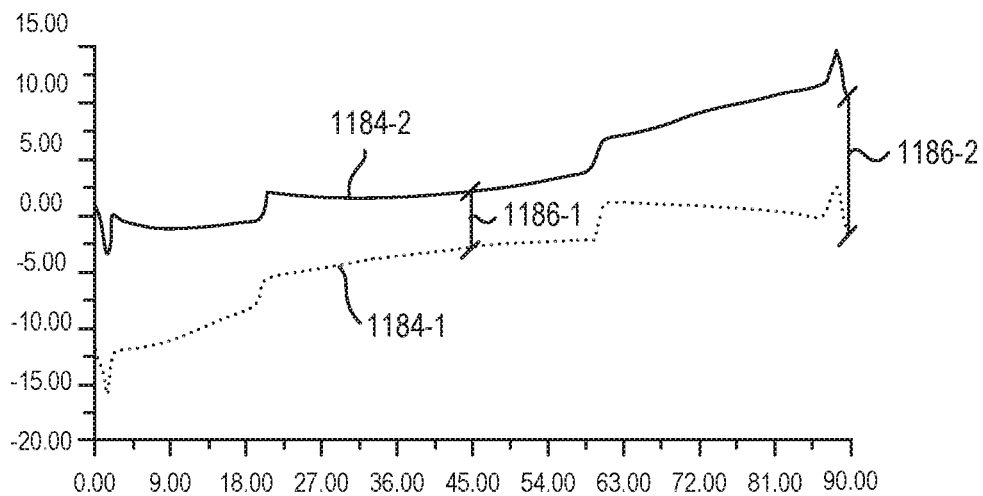
FIG. 18 is a graph illustrating two torque curves of a dampened and counterbalanced display system.

When the torque curve of the connection mechanism, the dampening device, the counterbalance device, and the gravitational moment are considered together, a display system may have two different force curves 1184-1, 1184-2 that may control the rotation and translation of a display supported by a base. FIG. 18 illustrates a first force curve 1184-1 of a display system. The first force curve 1184-1 is similar to the torque curve described in relation to FIG. 3 with additional counterbalance force and dampening force as the display system moves from the first position to the second position. The second force curve 1184-2 is similar to the torque curve described in relation to FIG. 3 with additional counterbalance force and dampening force as the display system moves from the second position to the first position. The second force curve 1184-2 is the same curve as the first force curve 1184-1 with the dampening device applying the dampening force in the opposite direction (due to the rotation and translation being oriented in the opposite direction). The dampening may be greater near the first position and/or second position causing a greater end displacement 1186-2 between the force curves 1184-1, 1184-2 near the ends of the force curves 1184-1, 1184-2 than a center displacement 1186-1 in the center of the force curves 1184-1, 1184-2. The dampening device may impart a hysteresis to the force curves 1184-1, 1184-2, both slowing the rotation and dissipating energy of the system.

A display system according to the present disclosure may allow for the display of visual information or virtual environments in a plurality of orientations. For example, the display system may present visual information and/or virtual environments according to a fixed reference frame irrespective of rotation, translation, or other movement of the display in real time. In other words, movement of the display may alter the "frame" through which a user views the visual information and/or virtual environment without moving the visual information and/or virtual environment relative to an initial position. In at least one example, a virtual element may remain stationary on the display relative to a base of the display system during rotation and/or translation of the display relative to the base.

Figure 19:
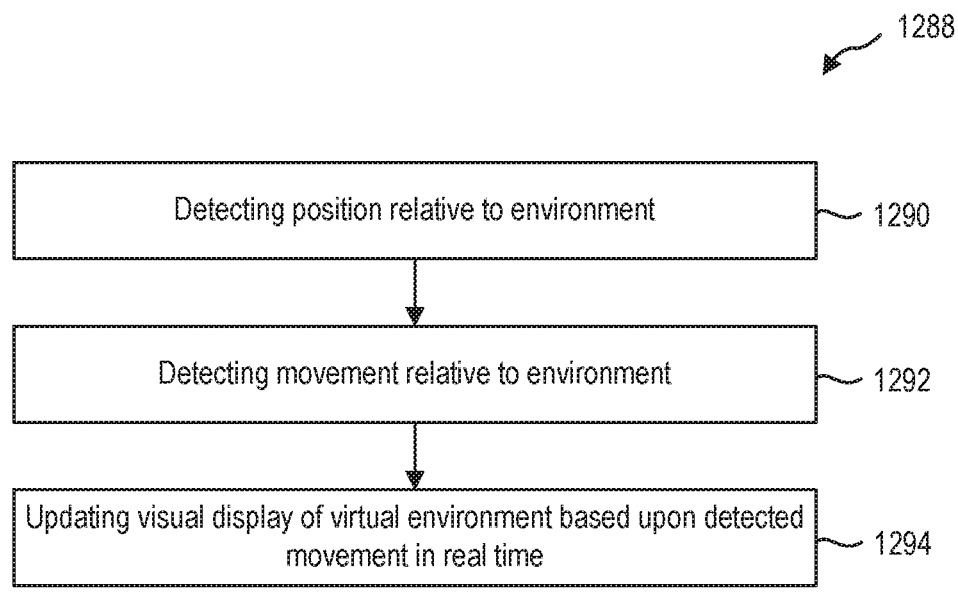
FIG. 19 is a flowchart illustrating a method of present visual information to a user.

Referring now to FIG. 19, in some implementations, a method 1288 may include detecting a position of the display relative to the surrounding environment at 1290. The presentation of the visual information and/or virtual environments may be rotated and/or translated relative to the display as the display rotates and/or translates relative to the environment and/or user. In some implementations, detecting the position of the display may include measuring a direction of gravity using an accelerometer. For example, the display may include an accelerometer in the housing of the display to measure a gravitational direction relative to the display. In some examples, a display system according to the present disclosure may be used in a moving vehicle or other moving environment, such that an accelerometer may receive readings related to gross movement of the display system. In such applications, the display system may include an accelerometer positioned in the housing and in the base, allowing the display system to measure relative changes between the display and base.

In other implementations, detecting the position of the display may include measuring a rotation of a gyroscope positioned in the housing of the display. The gyroscope may measure rotation and/or other movement of the display relative to an initial position. In some examples, a display system may include a gyroscope in each of the display and the base, such that relative movement of the display and base may be measured.

In yet other implementations, a camera positioned in the display housing may capture images of the surrounding environment of the display. The camera may compare images of the surrounding environment to recognize rotation and/or translation of the display relative to the surrounding environment. In at least one implementation, the display system may present visual information and/or virtual environments to a user in a zero-gravity or other dynamically moving environment in which a gravitational direction is irrelevant to the orientation of the visual information and/or virtual environments on the display. For example, a display system may be used on the International Space Station or in an airliner, in which the forces and the inertial reference frame of the display system may be unrepresentative of the position of users interacting with the display system. In such implementations, a camera of the display system may identify the orientation of user faces and detect the position of the display relative to the users in the surrounding environment.

In at least one example, detecting the position of the display relative to the environment may include detecting the position of the display relative to the base. For example, the base may be assumed to be oriented at a fixed relationship to gravity, users, or other relevant aspects of the environment. Detecting the position of the display may, therefore, be extrapolated to a position of the display relative to the environment.

The method 1288 may further include detecting movement of the display relative to the surrounding environment at 1292. Detecting the movement of the display relative to the environment may include measuring the amount of rotation of the display, the amount of translation of the display, the rate of rotation of the display, the rate of translation of the display, or combinations thereof. For example, detecting movement of the display relative to the environment may include detecting the position of the display relative to the environment and comparing the current position against a previous position or against a known origin position.

In some implementations, detecting movement of the display relative to the environment may include detecting a position of the display relative to the environment in real time. For example, detecting the movement in real time may include detecting the position of the display relative to the environment with a detection frequency of at least 10 Hz (i.e., the display position may be measured at least ten time per second). In other examples, the display system may detect the position of the display relative to the environment with a detection frequency of at least 24 Hz. In other words, the detection frequency may be that of a conventional cinemagraphic image refresh rate. The detection frequency may also utilize other standard refresh rates and/or the refresh rate of the display. In yet other examples, the display system may detect the position of the display relative to the environment with a detection frequency of at least 48 Hz. In further examples, the display system may detect the position of the display relative to the environment with a detection frequency of at least 60 Hz. In yet further examples, the display system may detect the position of the display relative to the environment with a detection frequency of at least 120 Hz. In still further examples, the display system may detect the position of the display relative to the environment with a detection frequency of at least 240 Hz.

The method 1288 may further include updating the visual display of the virtual environment based upon the detected movement in real time at 1294. In some implementations, the visual information and/or virtual environments may be translated and/or rotated on the display an equal and opposite amount of translation and rotation detected of the display. For example, in an implementation in which a 90° clockwise rotation and 100-millimeter downward translation is detected by the display system, a reference frame of the visual information and/or virtual environments may be rotated 90° counterclockwise and translated 100 millimeters upward. In other implementations, the visual information and/or virtual environments may be translated and/or rotated on the display an equal and opposite amount of rotation detected of the display and a different amount of translation detected of the display. In yet other implementations, the visual information and/or virtual environments may be translated and/or rotated on the display an equal and opposite amount of translation detected of the display and a different amount of rotation detected of the display. In other examples, the system may update a reference frame of the visual information and/or virtual environments in real time, such that the reference frame of the visual information and/or virtual environments is rotated and/or translated 10, 24, 48, 60, 120, 240, or more times per second.

In some implementations, updating the presentation of visual information may include changing a height of a window of the visual information and a width of the window of the visual information. In other implementations, updating a presentation of visual information may include moving or resizing at least one virtual element based on a change to the height or the width of the window.

Figures 1, 20:
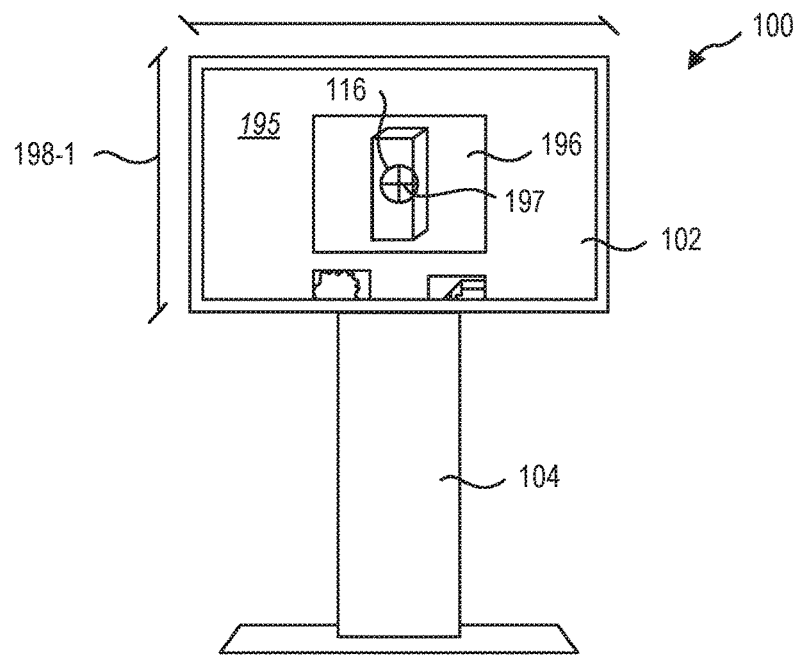
Figures 2, 20:
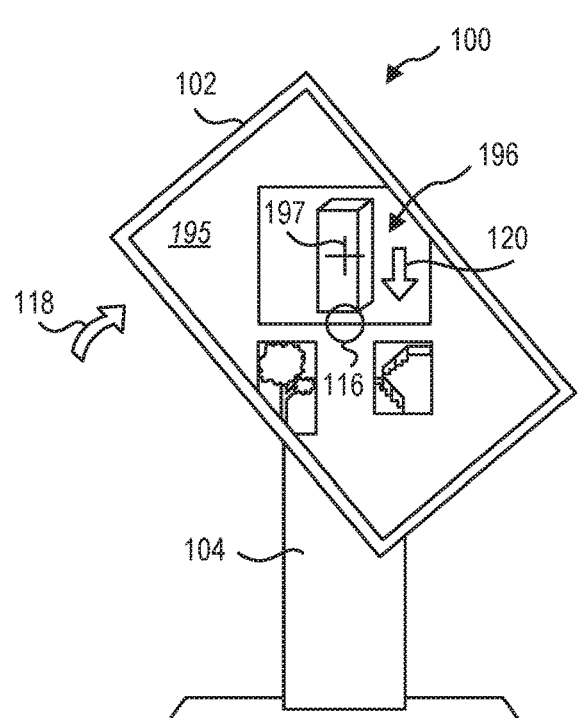
Figures 3, 20:
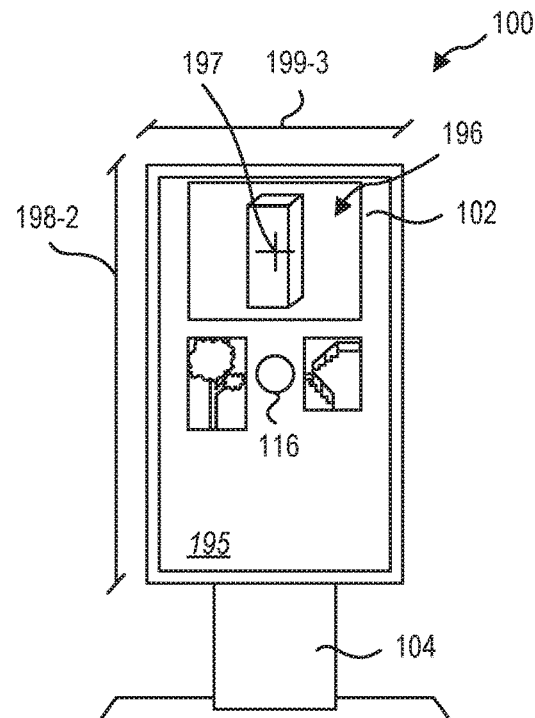

For example, FIG. 20-1 illustrates the implementation of a display system 100 described in relation to FIG. 1-1 through 1-5. In some implementations, the display system 100 may display a virtual environment 195. In at least one implementation, the virtual environment may include a remote environment (such as during a video conference) imaged by a camera of a remote computing device. In some implementations, the virtual environment 195 may include at least one virtual element 196. The virtual environment 195 and/or virtual element 196 may have an origin 197 or other reference frame location that may remain substantially stationary during movement of the display 102 relative to the surrounding environment or relative to the base 104.

In some implementations, the display 102 may present to a user a "window" of the virtual environment 195 with a first height 198-1 and a first width 199-1. During rotation of the display 102 relative to the base 104, the height and width of the window may change in real time based on the position of the display 102 relative to the surrounding environment and/or base 104. For the purposes of illustration, the origin 197 of the virtual environment 195 is shown to coincide with the pivot point 116 of the display system 100 in the first position (e.g., landscape orientation).

For example, FIG. 20-2 illustrates the display system 100 of FIG. 20-1 between a first position of the display 102 and a second position. The rotation 114 of the display 102 relative to the base 104 may produce a coupled translation 120 of the display 102 and/or the pivot point 116. The origin 197 of the virtual environment 195 and/or the virtual element 196 may translate and rotate an equal and opposite amount to the rotation 114 and translation 120 of the display 102. The origin 197 may, therefore, remain stationary relative to the base 104 and/or surrounding environment.

FIG. 20-3 illustrates the display system 100 of FIG. 20-1 in a second position. The display 102 may present a "window" to the virtual environment 195 with a second height 198-2 and a second width 199-2. The second height 198-2 may be equivalent to the first width 199-1 and the second width 199-2 may be equivalent to the first height 198-1. The origin 197 may be in the same position relative to the base 104 in the second position relative as in the first position, while the portion of the virtual environment 195 and/or virtual element 196 presented within the window of the display 102 may be different.

In some implementations, the virtual environment 195 and/or virtual elements 196 may remain fixed relative to the origin 197. In other implementations, the virtual environment 195 and/or virtual elements 196 may move or resize relative to the origin 197 when the display system 100 moves between the first position and the second position. For example, at least one of the virtual elements 196 may move and/or resize to remain with the second height 198-2 and second width 199-2 of the window. In at least one example, some virtual elements 196 may remain stationary, such as a three-dimensional model of an object, while other virtual element 196, such as virtual elements of a user interface or other control elements of software may move when the display system 100 moves between the first position and the second position.

Figures 1, 21:
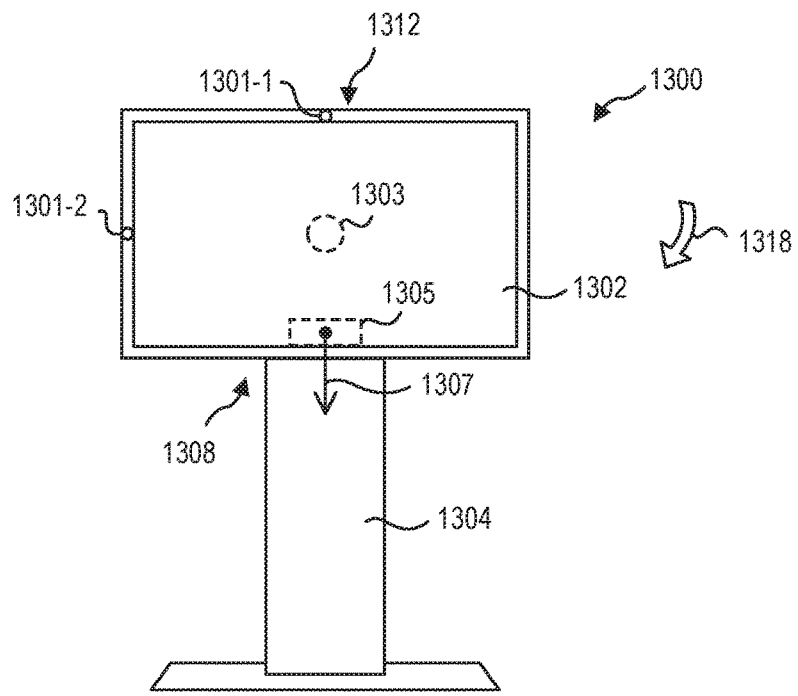
Figures 2, 21:
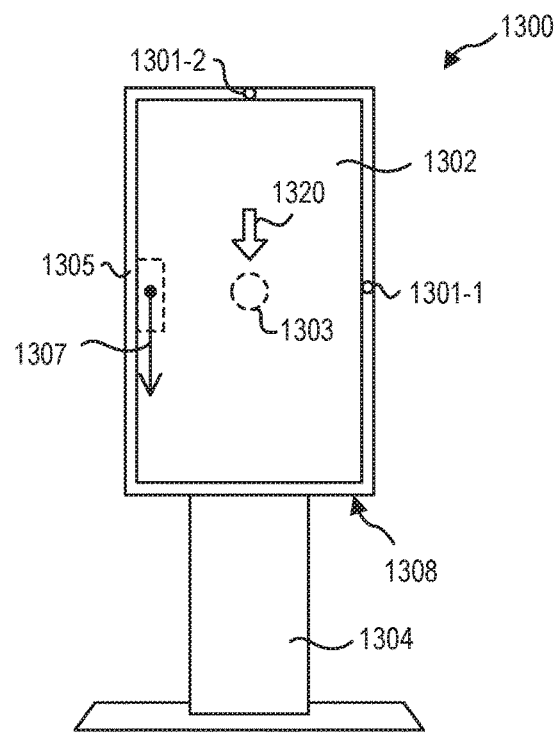

FIG. 21-1 illustrates another implementation of a display system 1300 including a display 1302 in communication with a computing device 1308. The display 1302 is configured to display visual information provided to the display by the computing device 1308. The computing device 1308 may further be in data communication with one or more orienting devices that may detect or measure the orientation and/or position of the display 1302 relative to the surrounding environment and/or the base 1304 of the display system 1300.

In some implementations, the display system 1300 may include one or more cameras 1301-1, 1301-2 fixed to the display 1302. The cameras 1301-1, 1301-2 may image the surrounding environment and provide information to the computing device 1308 regarding relative movement between frames captured by the cameras 1301-1, 1301-2. In some implementations, at least one camera 1301-1, 1301-2 may be a visible light camera that enables image recognition. In other implementations, at least one camera 1301-1, 1301-2 may be a depth sensing camera that enables three-dimensional imaging of the surrounding environment. For example, the depth sensing camera may be a time-of-flight camera. In other examples, the depth sensing camera may be a structured light camera. In yet further examples, the depth sensing camera may include an illuminator, such as an infrared light illuminator, that may allow the camera to image the surrounding environment in low ambient light situations. In other examples, the cameras 1301-1, 1301-2 may provide information to the computing device 1308 that may be used to detect and/or identify users positioned in the field of view of the cameras. The user identification may be used to detect the orientation and/or position of the cameras 1301-1, 1301-2. The user identification may further be used for biometric authentication purposed to use to the display system 1300.

In some implementations, the display system 1300 may have a first camera 1301-1 that is positioned at a top edge of the display 1302 in the first position, and a second camera 1301-2 that is positioned at a side edge of the display 1302 in the first position. The second camera 1301-2 may be positioned at a top edge of the display 1302 upon rotation and translation of the display 1302 to the second position (such as shown in FIG. 21-2).

In some implementations, the display system 1300 may include a plurality of contacts positioned between components of the connection mechanism 1312 or between the base 1304 and the display 1302. The contacts may be electrical contacts that communicate to the computing device 1308 the rotational and/or translational position of the display 1302 relative to the base 1304. In other examples, the contacts may be surface features, such as detents, ridges, bumps, or other relief features that engage with an accelerometer, a pressure switch, or other contact detection device that may detect when the contact detection device moves past the surface features. For example, ridges may oscillate an accelerometer, indicating motion of the display 1302 relative to the based 1304.

In some implementations, the computing device 1308 may be in data communication with a gyroscope 1303 that may measure the rotation 1318 of the display 1302 relative to the environment or relative to a known orientation. The display system 1300 may further include an accelerometer 1305 configured to measure a gravitational direction 1307 relative to the display 1302. For example, the accelerometer may detect movement of the display by measuring changes in a direction of gravity with an accelerometer. Referring now to FIG. 21-2, the second position of the display system 1300 may position the second camera 1301-2 at the top edge of the display 1302. The cameras 1301-1, 1301-2, gyroscope 1303, accelerometer 1305, or combinations thereof may measure the translation 1320 of the display 1302 and provide rotation and/or translation information to the computing device 1308. The computing device 1308 may then receive the rotation and/or translation information and calculate a translation and rotation of the reference frame for the virtual environment to render the window of the virtual environment and/or virtual elements based upon the rotated and translated virtual reference frame, as described in relation to FIG. 20-1 through 20-3.

For example, the computing device 1308 may receive rotation information and calculate a reference frame translation and rotation of a virtual environment. The computing device 1308 may then rotate and translate a reference frame of the virtual environment according to the calculated reference frame translation and rotation.

In some implementations, the computing device may provide visual information to the display to translate the origin of the virtual environment and/or virtual elements to move the window and better utilize the available display area of the display. FIG. 22-1 illustrates another implementation of a display system 1400 including a display 1402 in communication with a computing device 1408. The display 1402 is configured to display visual information provided to the display by the computing device 1408. In some implementations, the display system 1400 may display a virtual environment 1495 or a remote environment (such as during a video conference). In some implementations, the virtual environment 1495 may include at least one virtual element 1496. The virtual environment 1495 and/or virtual element 1496 may have an origin 1497 or other reference frame location that may translate during movement of the display 1402 relative to the surrounding environment or relative to the base 1404.

In some implementations, the display 1402 may present to a user a "window" of the virtual environment 1495 with a first height 1498-1 and a first width 1499-1. During rotation of the display 1402 relative to the base 1404, the height and width of the window may change in real time based on the position of the display 1402 relative to the surrounding environment and/or base 1404.

For example, FIG. 22-2 illustrates the display system 1400 of FIG. 22-1 between a first position of the display 1402 and a second position. The rotation 1418 of the display 1402 relative to the base 1404 around the pivot point 1416 may be measured by one or more orienting device (such as those described in relation to FIG. 21-1 and FIG. 21-2. The origin 1497 of the virtual environment 1495 and/or the virtual element 1496 may rotate an equal and opposite amount to the rotation 1418 of the display 1402. A translation 1420 of the origin 1497 may be couple to the rotation 1418 of the display 1402. The origin 1497 may, therefore, move "upward" relative to the base 1404 and/or surrounding environment.

FIG. 22-3 illustrates the display system 1400 of FIG. 20-1 in a second position. The display 1402 may present a "window" to the virtual environment 1495 with a second height 1498-2 and a second width 1499-2. The second height 1498-2 may be equivalent to the first width 1499-1 and the second width 1499-2 may be equivalent to the first height 1498-1. The origin 1497 may have translated upward relative to the base 1404 in the second position relative as in the first position, while the portion of the virtual environment 1495 and/or virtual element 1496 presented within the window of the display 1402 may be different.

In some implementations, the virtual environment 1495 and/or virtual elements 1496 may remain fixed relative to the origin 1497. In other implementations, the virtual environment 1495 and/or virtual elements 1496 may move or resize relative to the origin 1497 when the display system 1400 moves between the first position and the second position. For example, at least one of the virtual elements 1496 may move or resize to remain with the second height 1498-2 and second width 1499-2 of the window. In at least one example, some virtual elements 1496 may remain stationary, such as a three-dimensional model of an object, while other virtual element 1496, such as virtual elements of a user interface or other control elements of software may move when the display system 1400 moves between the first position and the second position.

In some implementations, a display system according to the present disclosure may allow a user to rotate a display of a computing device with a virtual environment that updates in real time to keep the virtual environment stationary as the display rotates and translates. In at least one implementation, a display system according to the present disclosure may allow a user to rotate and translate a large format display with less than 8.0 pound-feet (10.8 Newton-meters) of torque, and the display system may "pull in" to one or more stable positions without user intervention.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one implementation" or "an implementation" of the present disclosure are not intended to be interpreted as excluding the existence of additional implementations that also incorporate the recited features. For example, any element described in relation to an implementation herein may be combinable with any element of any other implementation described herein. Numbers, percentages, ratios, or other values stated herein are intended to include that value, and also other values that are "about" or "approximately" the stated value, as would be appreciated by one of ordinary skill in the art encompassed by implementations of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to implementations disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the implementations that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described implementations are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A device for supporting an electronic display, the device comprising:
   a base;
   a display mount movably connected to the base having a first position and a second position; and
   a connection mechanism positioned between the mount and the base, the connection mechanism configured to rotate and translate the display mount from the first position and the second position according to a torque curve, the torque curve including:
      a discovery stage adjacent the first position, the connection mechanism applying a force toward the first position in the discovery stage;

an initiation stage rotationally after the discovery stage and having an initiation force greater than the discovery stage, the initiation force applied toward the first position; and an approach stage rotationally after the initiation stage, the approach stage having an approach force applied toward the second position.

2. The device of claim 1, the force profile further including a homing stage after the approach stage.

3. The device of claim 1, the discovery stage being within 5° of the first position.

4. The device of claim 1, the initiation stage having an angular width less than 15°.

5. The device of claim 1, the discovery stage having a maximum torque of less than 2.0 pound-feet (2.7 Newton-meters) of torque.

6. The device of claim 1, the initiation stage having a maximum torque of less than 40 pound-feet (54.2 Newton-meters) of torque.

7. The device of claim 1, the approach force being applied toward the second position.

8. A device for supporting an electronic display, the device comprising:
a base;
a display mount movably connected to the base having a first position and a second position;
a connection mechanism positioned between the display mount and the base, the connection mechanism configured to rotate and translate the mount between the first position and the second position according to a torque curve, the torque curve including:
applying an initiation force toward the first position in a first half of the torque curve, and
applying an approach force toward the second position in a second half of the torque curve; and
a dampening device, the dampening device providing dampening during rotation of the connection mechanism between the first position and the second position.

9. The device of claim 8, the dampening device providing constant dampening.

10. The device of claim 8, the dampening device providing variable dampening.

11. The device of claim 10, the variable dampening being relative to a rotational rate of the connection mechanism.

12. The device of claim 8, the dampening device allowing a maximum rotational rate of less than 45° per second.

13. The device of claim 8, the dampening device being a dampening motor.

14. The device of claim 13, the dampening motor having a non-circular gear.

15. The device of claim 13, the dampening motor applying greater dampening in a final 10° of a range of rotation of the connection mechanism.

16. A device for supporting an electronic display, the device comprising:
a base;
a display mount movably connected to the base having a first position and a second position; and
a connection mechanism positioned between the mount and the base, the connection mechanism configured to rotate and translate the mount between the first position and the second position according to a torque curve, the torque curve including:
a discovery stage adjacent the first position, the connection mechanism applying a force toward the first position in the discovery stage;
an initiation stage rotationally after the discovery stage and having an initiation force greater than the force of the discovery stage, the initiation force applied toward the first position; and
a balanced stage rotationally after the initiation stage, where the connection mechanism applies no net force in the balanced stage.

17. The device of claim 16, further comprising an approach stage and a homing stage, the connection mechanism applying a greater torque in the homing stage than the approach stage.

18. The device of claim 16, the balanced stage being an unstable equilibrium location.

19. The device of claim 16, the balanced stage being at least 1° in angular width.

20. The device of claim 16, the torque curve being continuous from the first position to the second position.

* * * * *